United States Patent
Hayashi et al.

(10) Patent No.: US 6,495,878 B1
(45) Date of Patent: Dec. 17, 2002

(54) INTERLAYER OXIDE CONTAINING THIN FILMS FOR HIGH DIELECTRIC CONSTANT APPLICATION

(75) Inventors: Shinichiro Hayashi, Osaka (JP); Vikram Joshi, Colorado Springs, CO (US); Narayan Solayappan, Colorado Springs, CO (US); Joseph D. Cuchiaro, Colorado Springs, CO (US); Carlos A. Paz de Araujo, Colorado Springs, CO (US)

(73) Assignees: Symetrix Corporation, Colorado Springs, CO (US); Matsushita Electric Industrial Co., Ltd. (JP)

(*) Notice: Subject to any disclaimer, the term of this patent is extended or adjusted under 35 U.S.C. 154(b) by 0 days.

(21) Appl. No.: 09/365,628

(22) Filed: Aug. 2, 1999

(51) Int. Cl.$^7$ .................. H01L 27/108; H01L 29/76; H01L 29/94; H01L 31/119; H01L 31/062
(52) U.S. Cl. .................. 257/310; 257/295
(58) Field of Search ................. 257/295, 310

(56) References Cited

U.S. PATENT DOCUMENTS

| | | | |
|---|---|---|---|
| 3,731,163 A | | 5/1973 | Shuskus |
| 4,219,866 A | | 8/1980 | Maher |
| 4,324,750 A | | 4/1982 | Maher |
| 5,124,777 A | | 6/1992 | Lee |
| 5,456,945 A | | 10/1995 | McMillan et al. |
| 5,519,234 A | | 5/1996 | Paz de Araujo et al. |
| 5,519,566 A | | 5/1996 | Perino et al. |
| 5,555,219 A | | 9/1996 | Akiyama et al. |
| 5,585,300 A | * | 12/1996 | Summerfelt ............. 438/3 |
| 5,736,759 A | | 4/1998 | Haushalter |
| 5,833,745 A | | 11/1998 | Atsuki et al. |
| 6,057,584 A | * | 5/2000 | Gardner et al. ......... 257/411 |
| 6,140,672 A | | 10/2000 | Arita et al. |
| 6,159,752 A | * | 12/2000 | Katoh ..................... 438/3 |
| 6,194,752 B1 | * | 2/2001 | Ogasahara et al. ...... 257/295 |

FOREIGN PATENT DOCUMENTS

| | | |
|---|---|---|
| EP | 0 270 099 | 6/1988 |
| EP | 0 807 965 | 11/1997 |
| EP | 0 854 504 | 7/1998 |
| EP | 0 869 557 A2 | 10/1998 |
| EP | 0 910 120 A2 | 4/1999 |
| JP | 07-202138 A * | 8/1995 |
| WO | 98/53506 | 11/1998 |

OTHER PUBLICATIONS

Guo et al., "Pulsed laser deposition of SrxBa1–nNb2(6/MgO bilayered films on Si wafer in waveguide form," IOP Publishing Ltd. (United Kingdom), p. 1632–1635 (1996).

(List continued on next page.)

*Primary Examiner*—Olik Chaudhuri
*Assistant Examiner*—Howard Weiss
(74) *Attorney, Agent, or Firm*—Patton Boggs LLP

(57) ABSTRACT

A high dielectric constant insulator including a thin film of a metal oxide selected from the group consisting of tungsten-bronze-type oxides, pyrochlore-type oxides, and combinations of $Bi_2O_3$ with an oxide selected from the group consisting of perovskites and pyrochlore-type oxides. An embodiment contains metal oxides represented by the general stoichiometric formulas $AB_2O_6$, $A_2B_2O_7$ and $A_2Bi_2B_2O_{10}$, wherein A represents A-site atoms selected from the group of metals consisting of Ba, Bi, Sr, Pb, Ca, K, Na and La; and B represents B-site atoms selected from the group of metals consisting of Ti, Zr, Ta, Hf, Mo, W and Nb. Preferably, the metal oxides are $(Ba_xSr_{1-x})(Ta_yNb_{1-y})_2O_6$, where $0 \leq x \leq 1.0$ and $0 \leq y \leq 1.0$; $(Ba_xSr_{1-x})_2(Ta_yNb_{1-y})_2O_7$, where $0 \leq x \leq 1.0$ and $0 \leq y \leq 1.0$; and $(Ba_xSr_{1-x})_2Bi_2(Ta_yNb_{1-y})_2O_{10}$, where $0 \leq x \leq 1.0$ and $0 \leq y \leq 1.0$. Thin films according to the invention have a relative dielectric constant $\geq 40$, and preferably about 100. The value of Vcc in the metal oxides of the invention is close to zero. The value of Tcc is <1000 ppm, preferably <100.

36 Claims, 8 Drawing Sheets

OTHER PUBLICATIONS

Ollivier et al., "A "Chimie Douce" Sythesis[sic] of Perovskite–Type SrTa2O6 and SrTa2–xNbxO61," Chem. Mater., American Chemical Society, p. 2585–2587 (1998).

Yamauchi, N., "A Metal–Insulator–Semiconductor (MIS) Device Using a Ferroelectric Polymer Thin Film in the Gate Insulator", Apr. 1985, Japanese Journal of Applied Physics, vol. 25, No. 4, pp. 590–594.*

Auciello et al., "The Physics of Ferroelectric Memories," Physics Today, American Institute of Physics, vol. 51, (No. 7), p. 22–27 (Jul., 1998).

Hiroshi Ishiwara, "Current Status and Prospects of FET–Type Ferroelectric Memories," presented at DRCC Device Research Conference in Santa Barbara, CA, p. 6–9 (Jun. 21–23, 1999).

Hiroshi Ishiwara, "SrTa2O6/SiON," paper presented in Japan, p. 1–24 (last week of Jun. or first week of Jul., 1999).

* cited by examiner

INTERLAYER OXIDE CONTAINING THIN FILMS FOR HIGH DIELECTRIC CONSTANT APPLICATION

BACKGROUND OF THE INVENTION

Field of the Invention

The invention in general relates to metal oxide materials with optimized stoichiometry in integrated circuits, having high dielectric constants, capacitances and other electrical properties that are virtually independent of voltage and temperature.

Statement of the Problem

It is well known that there is a need for a high dielectric constant material suitable for use as a charge storage medium in integrated circuits and related applications, such as the bypass capacitor in microwave monolithic integrated circuits (MMICs). The most commonly used dielectric material used for charge storage in integrated circuits is silicon dioxide, which has a dielectric constant of about 4. Other common dielectric materials used for charge storage, such as $Si_3N_4$, $Al_2O_3$ and $Ta_2O_5$, also have low dielectric constants, ranging from 4 to 20. Storage capacitors using such a material must have a large area to provide the capacitive values required in state-of-the-art integrated circuits. These large areas make it difficult to reach high densities of capacitive components in an integrated circuit or MMIC. However, the use of other materials to provide the dielectric in integrated circuits has been hindered by the fact that commonly-used materials with high dielectric constants often have undesirable properties. For example, ferroelectric materials such as lead zirconium titanate (PZT) are known to have high dielectric constants and therefore have been proposed as candidates for high dielectric constant memories. However, it is well-known in the art that ferroelectric materials should not be used in high dielectric constant DRAMs since they produce a large switching charge at the coercive voltage, which switching charge would mask the conventional linear charge that the DRAM utilizes as a memory storage medium. See, O. Auciello, J. F. Scott, and R. Ramesh, "The Physics of Ferroelectric Memories", *Physics Today*, 51, No. 7, July 1998, pp. 22–27, particularly "Box 1" on page 24. Moreover, PZT and other high dielectric materials display a significant, nonlinear dependence of dielectric constant on temperature and applied voltage. If used as a capacitor dielectric or a bypass capacitor, the material causes the capacitance value to change with temperature and voltage. Materials in which the electronic properties change with temperature and voltage are generally undesirable in integrated circuits and MMICs, since the effective operation of the circuits requires that the electronic properties have specified values, and integrated circuits should be able to operate over a range of temperatures and voltages. PZT and other high dielectric materials often have electronic properties that do not scale; that is, the properties change significantly as the material is made thinner. Such lack of scaling can place stringent requirements on processing that are difficult to meet, and require wholesale redesign of circuits as they are made more dense. Thus, it would be highly desirable to have a high dielectric constant material for which the electronic properties scale and are essentially independent of temperature and voltage.

It would also be useful to have a high dielectric constant capacitor that can be used generally in integrated circuits, such as for gate dielectric films in metal-oxide-semiconductor field effect transistors (MOSFETs), ferroelectric field effect transistors (ferroelectric FETs), and other transistors, as buffer layers to prevent unwanted interactions between certain materials, as diffusion barriers to prevent diffusion of elements from one layer to another, and as interlayer dielectrics. In each of these applications it is useful that the material have electronic values that do not change with temperature and voltage. In addition, each of these applications have additional electronic requirements. It is particularly difficult to predict if a high dielectric material will be effective in gate insulator films in MOSFETs, ferroelectric FETs, and other transistors because, in this application, it must meet multiple, often conflicting, requirements. In addition to having a capacitance that is flat with respect to temperature, voltage and thickness variations, they must have low leakage current and a high breakdown voltage, they must not alter the threshold voltage of the transistor as a function of gate voltage, and they must be an effective barrier against charge injection. Buffer layers must be compatible with both the material they buffer and the surrounding integrated circuit materials. Diffusion barriers must be effective in preventing migration of particular elements at elevated temperatures and must not themselves include elements that can migrate. Interlayer dielectrics must have low leakage currents and have a high breakdown voltage. As integrated circuits become smaller, all the above requirements become more and more stringent, since thicknesses of the materials decrease and the distances between dissimilar materials shrink. The paucity of materials that have a dielectric constant greater than 20, but do not possess problematic properties, is considered to be one of the serious roadblocks to higher density integrated circuit memories.

Recently, commercial ferroelectric memories, particularly ferroelectric random access memories (FERAMs), have become available. While practical FERAMs have not yet reached the densities of DRAMs, rapid advances are being made in this area that suggest that these memories may soon become competitive with DRAMs. Since these memories, like DRAMs, are optimally intended for use in environments in which the temperature and voltage can change substantially, it would be highly useful to have ferroelectric materials for which the electronic properties scale and are essentially independent of temperature and voltage.

Solution to the Problem

The present invention solves the above problem by providing an integrated circuit incorporating a thin film of metal oxide for which the electronic properties have low dependence on voltage and temperature. The invention also provides a liquid precursor for forming a thin film of metal oxide for which the electronic properties scale and have low dependence on voltage and temperature. In addition, the invention provides a method for applying a liquid precursor to an integrated circuit substrate and treating the applied precursor to form the thin film of the metal oxide for which the electronic properties have low dependence on voltage and temperature. Preferably, the metal oxide is a high dielectric constant material, and most preferably it is not ferroelectric. However, some of the materials are ferroelectric, and therefore will be useful in ferroelectric devices, such as FERAMs.

An embodiment of the invention is an integrated circuit comprising a high dielectric constant metal oxide insulator thin film or ferroelectric metal oxide thin film, wherein the metal oxide is selected from the group consisting of tungsten-bronze-type oxides, pyrochlore-type oxides, and combinations of an interlayer oxide with an oxide selected from the group consisting of pyrochlore-type oxides and tungsten-bronze-type oxides. Typically, the interlayer oxide is $Bi_2O_3$.

In an embodiment of the invention, the metal oxide has a stoichiometry represented by a formula selected from the group consisting of $AB_2O_6$, $A_2B_2O_7$ and $A_2Bi_2B_2O_{10}$, wherein A represents A-site atoms selected from the group of metals consisting of Ba, Bi, Sr, Pb, Ca, K, Na and La; and B represents B-site atoms selected from the group of metals consisting of Ti, Zr, Ta, Hf, Mo, W and Nb.

An integrated circuit according to the invention contains a thin film of metal oxide with a thickness preferably ranging from 1 nanometer (nm) to 500 nm. Metal oxide material according to the invention is preferably non-ferroelectric and has a relatively high dielectric constant, i.e., a dielectric constant value, $\epsilon_{20}$, of 20 or higher. It shows negligible dependence of capacitance on temperature and on external applied voltage, having low Vcc values and low Tcc values. Typical applications of these materials are as the dielectric material in the capacitor of DRAMs, the gate dielectric of transistors, including ferroelectric FETs, as buffer layers to prevent unwanted interactions between certain materials, particularly layered superlattice materials and semiconductors, as diffusion barriers to prevent diffusion of elements from one layer to another, and as interlayer dielectrics. Some of the materials according to the invention are ferroelectric, and a typical application of these materials is as part of a memory cell in an integrated circuit ferroelectric random access memory (FERAM) or as a ferroelectric gate in ferroelectric FETs.

A liquid precursor according to an embodiment of the invention comprises metal atoms in relative molar proportions for forming a metal oxide selected from the group consisting of tungsten-bronze-type oxides, pyrochlore-type oxides, and combinations of an interlayer oxide, such as $Bi_2O_3$, with an oxide selected from the group consisting of pyrochlore-type oxides and tungsten-bronze-type oxides. In an embodiment of the invention, the liquid precursor contains metal atoms having a stoichiometry represented by a formula selected from the group consisting of $AB_2O_6$, $A_2B_2O_7$ and $A_2Bi_2B_2O_{10}$, wherein A represents A-site atoms selected from the group of metals consisting of Ba, Bi, Sr, Pb, Ca, K, Na and La; and B represents B-site atoms selected from the group of metals consisting of Ti, Zr, Ta, Hf, Mo, W and Nb.

An embodiment of the method of the invention comprises steps of: providing a substrate; providing a liquid precursor for forming a thin film of the above-discussed metal oxide; applying the liquid precursor to the substrate to form a liquid coating on the substrate; and treating the liquid coating to form a solid thin film of the desired metal oxide. The step of applying may comprise spin-coating a liquid coating of the precursor on the substrate, misted deposition, dip coating or other liquid application process. The step of treating may comprise a process selected from the group including: exposing to vacuum, exposing to ultraviolet radiation, drying, heating, baking, rapid thermal processing, and annealing. An embodiment of the inventive method includes providing a liquid precursor comprising metal atoms in relative molar proportions corresponding to an interlayer oxide, such as $Bi_2O_3$, added to a precursor of a perovskite or a pyrochlore-type oxide compound.

The excellent properties of the material and the ability to make very thin films of the material that retain those properties over wide ranges of temperature and voltage make the invention of particular importance for integrated circuits, but it is also important for any type of charge storage device. Numerous other features, objects and advantages of the invention will become apparent from the following description when read in conjunction with the accompanying drawings.

DESCRIPTION OF THE PREFERRED EMBODIMENT

Figure 1:
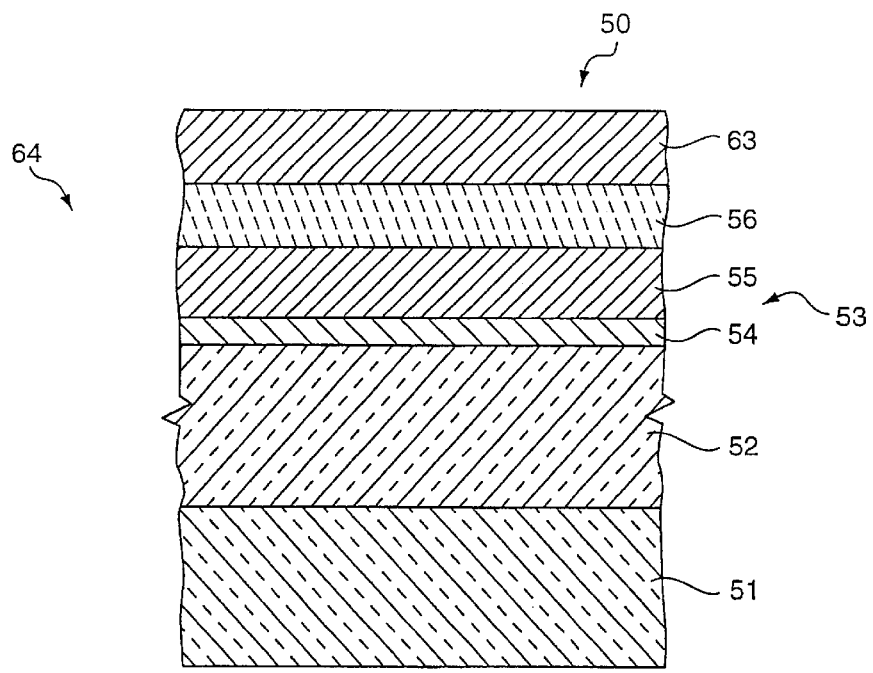
FIG. 1 is a cross-sectional view of an integrated circuit capacitor according to the invention.

The term "metal oxide" herein means a material of the general form $A_a B_b O_o$ or $A_a S_s B_b O_o$ where A, B and S are cations and O is the anion oxygen. The term is intended to include materials where A and B represent multiple elements; for example, it includes materials of the form $A'A''B_2O_6$, $A(B'B'')_2O_6$, $(A'A'')(B'B'')_2O_6$, $A'A''A'''B_2O_6$ et., where A, A', A'', A''', B, B' and B'' are different metal elements. Preferably, A, A', A'', A''', etc. are metals selected from the group of metals including Ba, Bi, Sr, Pb, Ca, and La, and are referred to as A-site atoms; and B, B', B'', etc. are metals selected from the group including Ti, Zr, Ta, Hf, Mo, W, and Nb. B, B', B'', etc. are collectively referred to herein as B-site atoms. The S-site element in the formula is referred to as the interlayer element herein and usually represents the element bismuth, Bi. The A-site and B-site material may be freely substituted for several equivalent materials as described above. In a material of the form $AA'B_2O_6$, the relative amounts of A-atoms and A'-atoms occupying A-sites in the crystal lattice are variable, but the total number of A-site atoms is fixed as above with respect to B-site atoms and oxygen atoms. The relative amounts may be expressed as a formula $(A_{1-x}A'_x)B_2O_6$ indicating that the total of A-site atoms equals one ($1-x+x=1$) combined with two B-site atoms and six oxygen atoms. Therefore, although the total of A-site and B-site atoms is fixed by the stoichiometrically balanced formula, the relative amounts of A and A' atoms are expressed by "1–x" and "x", respectively. Similar reasoning applies to situations in which there are three or more A-site elements, or a plurality of B-site or S-site elements.

The formulas used to represent the metal oxides of the invention are not always absolutely exact in the sense that the actual amount of oxygen anion in a solid thin film of metal oxide will vary in accordance with the actual chemical valence values of the metal cations. For example, the predominant valence value of Ta-atoms and Nb-atoms is +5, whereas the usual valence value of a Ti-atom is +4. The general stoichiometric formula $A_2B_2O_7$ is electrically balanced when the B-site atoms are Ta; for example, $(Ba_x Sr_{1-x})_2(Ta_y Nb_{1-y})_2 O_7$. If, on the other hand, the B-site atoms are Ti-atoms, then the actual relative amount of oxygen is slightly less than expressed in the general formula because the relative amounts of metal cations and oxygen anions must be in electrical balance, as determined by chemical valence values. In a liquid precursor for a particular chemical species, the relative molar proportions of the metal atoms and other atomic constituents (except oxygen) are usually present in the same proportions as represented in the stoichiometric formula of the desired chemical species. Exceptions occur for elements, such as bismuth, that form highly volatile compounds, and therefore may be depleted during the heating steps associated with producing the solid thin films. The metal atoms in the precursors are typically associated in various precursor compounds that react with each other during treatment after application onto the integrated circuit substrate.

The term "stoichiometric" herein may be applied to both a solid thin film of a metal oxide material and to a precursor for forming a material. When it is applied to a solid thin film, it refers to a formula which shows the actual relative amounts of each element in a final solid thin film. When applied to a precursor, it indicates the molar proportion of metals and other chemical elements (except oxygen) in the precursor. A "balanced" stoichiometric formula is one in which there is just enough of each element to form a complete crystal structure of the metal oxide, with all sites of the crystal lattice occupied, though in actual practice there always will be some defects in the crystal at room temperature. The chemical formulas disclosed here represent stoichiometric amounts of atoms in a thin film or a liquid precursor. They are not necessarily balanced stoichiometric formulas of particular crystalline structures or compounds.

As described in the book "Principles and Applications of Ferroelectrics and Related Materials", by M. E. Lines and A. M. Glass, Clarendon Press, Oxford (1977), a class of metal oxide compounds named "perovskites" can be represented by the general stoichiometric formula $ABO_3$, where A is a monovalent or divalent metal atom and B is a tetravalent or pentavalent metal. The crystalline perovskite structure can be viewed as a set of $BO_6$ octahedra arranged in a cubic pattern. Another class of metal oxide compounds forms $ABO_3$-type oxygen-octahedra crystalline structures closely related to the tetragonal tungsten bronzes. These metal oxide compounds with the formula $AB_2O_6$ (and multiples thereof, e.g., $(Ba_x Sr_{1-x})_5 Ta_{10} O_{30}$) are known as tungsten-bronze-type oxides. An embodiment of the present invention may include a thin film of a tungsten-bronze-type oxide in an integrated circuit device. In another aspect, the invention may be described as including a thin film of a metal oxide having the general formula $AB_2O_6$, where A represents A-site atoms selected from the group of metals including Ba, Bi, Sr, Pb, Ca, K, Na and La; and B represents B-site atoms selected from the group of metals including Ti, Zr, Ta, Hf, Mo, W and Nb. The term tungsten-bronze or tungsten-bronze-type as used herein includes all compounds known to have the tungsten-bronze-type structure as well as all compounds having the above formula, whether or not the compounds actually have the tungsten-bronze-type structure. When the metal oxide has the general formula $AB_2O_6$, it is preferably selected from the group of metal oxides including $(Ba_x Sr_{1-x})(Ta_y Nb_{1-y})_2 O_6$, where $0 \leq x \leq 1.0$ and $0 \leq y \leq 1.0$. Another class of metal oxides according to the invention are the pyrochlore-type oxides, which have the general formula $A_2B_2O_7$. An embodiment of the invention includes a thin film having the general formula $A_2B_2O_7$, where A represents A-site atoms selected from the group of metals including Ba, Bi, Sr, Pb, Ca, K, Na and La; and B represents B-site atoms selected from the group of metals including Ti, Zr, Ta, Hf, Mo, W and Nb. The term pyrochlore or pyrochlore-type as used herein includes all compounds known to have the pyrochlore-type structure as well as all compounds having the above formula, whether or not the compounds actually have the pyrochlore-type structure. When the metal oxide has the general formula $A_2B_2O_7$, preferably it is selected from the group of metal oxides including $(Ba_x Sr_{1-x})_2 (Ta_y Nb_{1-y})_2 O_7$, where $0 \leq x \leq 1.0$ and $0 \leq y \leq 1.0$. Perovskite and pyrochlore-type compounds may be ferroelectric or antiferroelectric. It is believed that the tungsten-bronze-type compounds are usually ferroelectrics.

In an embodiment of the invention, an integrated circuit comprises a thin film of a metal oxide that is a combination of an interlayer oxide with an oxide selected from the group consisting of perovskites and pyrochlore-type oxides. An interlayer oxide is an oxide containing a metal atom selected from the group of interlayer elements including Bi, Sc, Y, La, Sb, Cr and Tl. Preferably, it is bismuth oxide, $Bi_2O_3$. An embodiment of the invention, shown in FIG. 3, comprises a virtual stacked structure containing an interlayer oxide layer, preferably a $Bi_2O_3$ layer, alternating with a perovskite or a pyrochlore-type oxide layer. This structure is typically formed by applying a precursor to the substrate that contains metal atoms in relative amounts sufficient for forming a layered structure upon treating and annealing it. The precursor for forming a virtual stacked structure contains combined portions of metal atoms corresponding to the formula of the interlayer oxide, preferably $Bi_2O_3$, and to a stoichiometric formula for a perovskite or a pyrochlore-type oxide. The invention, however, does not include a virtual stacked structure that is referred to as a layered superlattice material as disclosed in U.S. Pat. No. 5,519,234, issued May 21, 1996 to Paz de Araujo et al.

Figure 4:
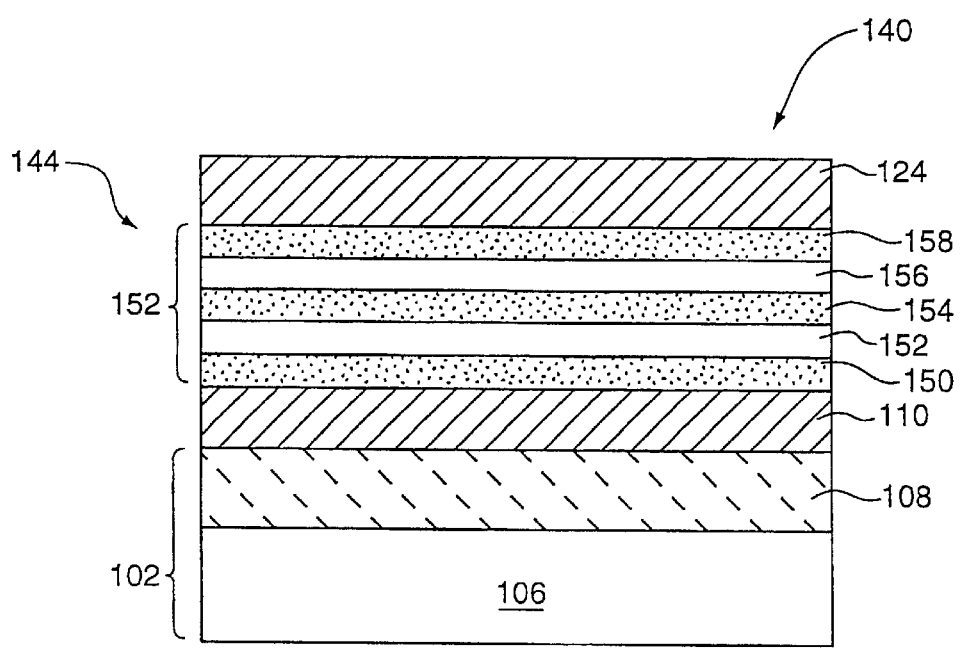
FIG. 4 depicts an integrated circuit device in which a thin film of metal oxide comprises an actual stacked structure combining alternating layers of metal oxide and bismuth oxide.

In another embodiment, shown in FIG. 4, the thin film of metal oxide comprises an actual stacked structure in which a layer of perovskite, tungsten-bronze-type or pyrochlore-type metal oxide has an interface with an alternating layer of an interlayer oxide, preferably bismuth oxide. This structure is formed by depositing each of the alternating layers individually and then annealing them to form the thin film.

In a particular embodiment of the invention, a pyrochlore-type oxide has the general chemical formula $A_2B_2O_7$, where A represents A-site atoms selected from the group of metals including Ba, Bi, Sr, Pb, Ca, K, Na and La; and B represents B-site atoms selected from the group of metals including Ti, Zr, Ta, Hf, Mo, W and Nb. Preferably, the pyrochlore-type oxide compound is $(Ba_xSr_{1-x})_2(Ta_yNb_{1-y})_2O_7$, where $0 \leq x \leq 1.0$ and $0 \leq y \leq 1.0$, and preferably $(Ba_xSr_{1-x})_2Ta_2O_7$, where $0 \leq x \leq 0.6$. When the pyrochlore-type oxide has the general chemical formula $A_2B_2O_7$, and it is combined with interlayer oxide $Bi_2O_3$, then the resulting combination has the general formula $A_2Bi_2B_2O_{10}$. When the pyrochlore-type oxide compound is $(Ba_xSr_{1-x})_2(Ta_yNb_{1-y})_2O_7$, where $0 \leq x \leq 1.0$ and $0 \leq y \leq 1.0$, then the resulting combination with bismuth oxide is a thin film having the composition $(Ba_xSr_{1-x})_2Bi_2(Ta_yNb_{1-y})_2O_{10}$, where $0 \leq x \leq 1.0$ and $0 \leq y \leq 1.0$.

Typically, an integrated circuit according to the invention contains a thin film of metal oxide with a thickness ranging from 1 nm to 500 nm, preferably in the range from 30 nm to 200 nm. The metal oxide thin film of the invention may be used as part of a memory cell in an integrated circuit, for example, as the capacitor dielectric in a DRAM cell, as a gate dielectric in a transistor, such as a MOSFET, as a buffer layer, a diffusion barrier layer, and an interlayer dielectric. In a typical embodiment of the invention, the integrated circuit contains a capacitor comprising a first electrode, a second electrode, and a thin film of high dielectric constant insulator located between the first and second electrodes, where the high dielectric constant insulator contains metal oxide material in accordance with the invention.

The terms "buffer" and "diffusion barrier" are sometimes used interchangeably in the art. In this disclosure, the term "buffer" is intended to be more general, and includes all the functions of a diffusion barrier, as well as other functions, while the term "diffusion barrier" is narrower, and includes only the function of providing a barrier to diffusion of chemical elements or compounds.

Metal oxide material according to the invention has a relative dielectric constant value, $\epsilon_{20}$, of 20 or higher, preferably about 100. It shows negligible dependence of capacitance on temperature and on external applied voltage. In the electronics art, the measure of the dependence of the capacitance on the temperature is generally given as the capacitance temperature coefficient, Tcc, which is defined as the rate of change of the capacitance per degree centigrade. The measure of the dependence of the capacitance on voltage is generally given as the capacitance voltage coefficient, Vcc, which is defined as the rate of change of the capacitance per volt. The metal oxide material has a broad range of temperature range operability. Some test capacitors had a temperature coefficient of capacitance, Tcc, not exceeding 100 ppm in the temperature range of 20° C. to 140° C. All test capacitors had a voltage coefficient of capacitance, Vcc, not exceeding ±1% over an applied voltage range of from zero volts to ±5 volts. Some metal oxide materials according to the invention can possess ferroelectric or antiferroelectric properties.

Accordingly, the invention provides a liquid precursor for fabricating a metal oxide insulator in an integrated circuit, which precursor comprises metal atoms in relative molar proportions sufficient to form a tungsten-bronze-type oxide compound when the atoms are bonded with oxygen. In particular, the invention provides a liquid precursor for a metal oxide having the general formula $AB_2O_6$, where A represents A-site atoms selected from the group of metals including Ba, Bi, Sr, Pb, Ca, K, Na and La; and B represents B-site atoms selected from the group of metals including Ti, Zr, Ta, Hf, Mo, W and Nb. When the metal oxide has the general formula $AB_2O_6$, it is preferably selected from the group of metal oxides including $(Ba_xSr_{1-x})(Ta_yNb_{1-y})_2O_6$, where $0 \leq x \leq 1.0$ and $0 \leq y \leq 1.0$. The invention also provides a liquid precursor for fabricating a metal oxide insulator in an integrated circuit, which precursor comprises metal atoms in relative molar proportions sufficient to form a pyrochlore-type oxide, having the general chemical formula $A_2B_2O_7$, where A represents A-site atoms selected from the group of metals including Ba, Bi, Sr, Pb, Ca, K, Na and La; and B represents B-site atoms selected from the group of metals including Ti, Zr, Ta, Hf, Mo, W and Nb. The invention also provides a liquid precursor for fabricating a metal oxide insulator in an integrated circuit, which precursor comprises metal atoms in relative molar proportions corresponding to a combination of an interlayer oxide, preferably $Bi_2O_3$, with a perovskite or a pyrochlore-type oxide when the atoms are bonded with oxygen. The resulting oxide is believed to have a virtual stacked structure comprising metal oxide layers alternating with bismuth oxide layers. In a particular embodiment of the invention, the pyrochlore-type oxide has the general chemical formula $A_2B_2O_7$, where A represents A-site atoms selected from the group of metals including Ba, Bi, Sr, Pb, Ca, K, Na and La; and B represents B-site atoms selected from the group of metals including Ti, Zr, Ta, Hf, Mo, W and Nb. Preferably, the pyrochlore-type oxide compound is $(Ba_xSr_{1-x})_2(Ta_yNb_{1-y})_2O_7$, where $0 \leq x \leq 1.0$ and $0 \leq y \leq 1.0$, and preferably $(Ba_xSr_{1-x})_2Ta_2O_7$, where $0 \leq x \leq 0.6$. When the pyrochlore-type oxide has the general chemical formula $A_2B_2O_7$, then the resulting combination has the general formula $A_2Bi_2B_2O_{10}$. When the pyrochlore-type oxide compound is $(Ba_xSr_{1-x})_2(Ta_yNb_{1-y})_2O_7$, where $0 \leq x \leq 1.0$ and $0 \leq y \leq 1.0$, then the resulting combination with a bismuth oxide precursor compound forms a dielectric thin film having the composition $(Ba_xSr_{1-x})_2Bi_2(Ta_yNb_{1-y})_2O_{10}$, where $0 \leq x \leq 1.0$ and $0 \leq y \leq 1.0$.

A liquid precursor according to an embodiment of the invention comprises metal atoms in relative molar proportions for forming a metal oxide having a stoichiometry represented by a formula selected from the group including $AB_2O_6$, $A_2B_2O_7$ and $A_2Bi_2B_2O_{10}$, wherein A represents A-site atoms selected from the group of metals including Ba, Bi, Sr, Pb, Ca, K, Na and La; and B represents B-site atoms selected from the group of metals including Ti, Zr, Ta, Hf, Mo, W and Nb. When the liquid precursor is selected to form a metal oxide having the general formula $AB_2O_6$, the metal oxide is preferably from the group of metal oxides including $(Ba_xSr_{1-x})(Ta_yNb_{1-y})_2O_6$, where $0 \leq x \leq 1.0$ and $0 \leq y \leq 1.0$. When the liquid precursor is selected to form a metal oxide having the general formula $A_2B_2O_7$, the metal oxide is preferably from the group of metal oxides including $(Ba_xSr_{1-x})_2(Ta_yNb_{1-y})_2O_7$, where $0 \leq x \leq 1.0$ and $0 \leq y \leq 1.0$. When the liquid precursor is selected to form a metal oxide having the general formula $A_2Bi_2B_2O_{10}$, the metal oxide is preferably from the group of metal oxides including $(Ba_xSr_{1-x})_2Bi_2(Ta_yNb_{1-y})_2O_{10}$, where $0 \leq x \leq 1.0$ and $0 \leq y \leq 1.0$.

A liquid precursor according to an embodiment of the invention comprises metal atoms in relative molar proportions for forming a metal oxide layer selected from the group consisting of a perovskite layer, a tungsten-bronze-type oxide layer and a pyrochlore-type oxide layer.

An embodiment of the inventive method of the invention comprises steps of: providing a substrate; providing a liquid precursor for forming a metal oxide selected from the group including $AB_2O_6$, $A_2B_2O_7$ and $A_2Bi_2B_2O_{10}$, wherein A represents A-site atoms selected from the group of metals including Ba, Bi, Sr, Pb, Ca, K, Na and La; and B represents B-site atoms selected from the group of metals including Ti, Zr, Ta, Hf, Mo, W and Nb; applying the liquid precursor to the substrate to form a liquid coating on the substrate; and treating the liquid coating to form a solid thin film of the metal oxide. When the metal oxide has the general formula $AB_2O_6$, the metal oxide is preferably from the group of metal oxides including $(Ba_xSr_{1-x})(Ta_yNb_{1-y})_2O_6$, where $0 \leq x \leq 1.0$ and $0 \leq y \leq 1.0$. When the metal oxide has the general formula $A_2B_2O_7$, the metal oxide is preferably from the group of metal oxides including $(Ba_xSr_{1-x})_2(Ta_yNb_{1-y})_2O_7$, where $0 \leq x \leq 1.0$ and $0 \leq y \leq 1.0$. When the metal oxide has the general formula $A_2Bi_2B_2O_{10}$, the metal oxide is preferably from the group of metal oxides including $(Ba_xSr_{1-x})_2Bi_2(Ta_yNb_{1-y})_2O_{10}$, where $0 \leq x \leq 1.0$ and $0 \leq y \leq 1.0$.

The method may further comprise steps of forming a first electrode and a second electrode, whereby the thin film of metal oxide is located between the first and second electrodes. Typically, the first electrode, the thin film and the second electrode are formed as part of a memory cell. The step of treating may comprise a process selected from the group including: exposing to vacuum, exposing to ultraviolet radiation, drying, heating, baking, rapid thermal processing, and annealing. The step of applying may comprise spin-coating a liquid coating of the precursor on the substrate or misted deposition, such as described in U.S. Pat. No. 5,456,945 issued to McMillan et al. on Oct. 10, 1995.

The invention also provides a method for forming a thin film of metal oxide having a virtual stacked structure comprising steps of: providing a substrate; providing a liquid precursor comprising metal atoms in relative molar proportions corresponding to an interlayer oxide, preferably $Bi_2O_3$, added to a precursor of a perovskite or a pyrochlore-type oxide; applying the liquid precursor to the substrate to form a liquid coating on the substrate; and treating the liquid coating to form a solid thin film of the metal oxide. In an embodiment of the method, the pyrochlore-type oxide compound is $A_2B_2O_7$, where A represents A-site atoms selected from the group of metals including Ba, Bi, Sr, Pb, Ca, K, Na and La; and B represents B-site atoms selected from the group of metals including Ti, Zr, Ta, Hf, Mo, W and Nb. When the pyrochlore-type oxide compound has the formula $A_2B_2O_7$, preferably it is $(Ba_xSr_{1-x})_2(Ta_yNb_{1-y})_2O_7$, where $0 \leq x \leq 1.0$ and $0 \leq y \leq 1.0$, preferably $(Ba_xSr_{1-x})_2Ta_2O_7$, where $0 \leq x \leq 0.6$. The step of treating may comprise a process selected from the group including: exposing to vacuum, exposing to ultraviolet radiation, drying, heating, baking, rapid thermal processing, and annealing. The step of applying may comprise spin-coating a liquid coating of the precursor on the substrate or misted deposition, such as described in U.S. Pat. No. 5,456,945 issued to McMillan et al. on Oct. 10, 1995.

The invention also provides a method for forming a thin film of metal oxide having an actual stacked structure comprising steps of: providing a substrate; providing a metal oxide precursor for forming a metal oxide selected from the group consisting of perovskites, tungsten-bronze-type oxides, and pyrochlore-type oxides; providing an interlayer oxide precursor for forming an interlayer oxide; applying the metal oxide precursor to the substrate to form a metal oxide precursor coating on the substrate; treating the metal oxide precursor coating to form a solid layer of the metal oxide; applying the interlayer oxide precursor to the substrate to form an interlayer oxide precursor coating on the substrate; treating the interlayer oxide precursor coating to form a solid layer of interlayer oxide; and annealing the layer of the metal oxide and the layer of interlayer oxide to form the thin film of metal oxide. Preferably, the interlayer oxide is bismuth oxide, $Bi_2O_3$.

Turning now to examples of integrated circuit devices in which the inventive materials and process may be used, it should be understood that FIGS. 1–4 and 12–16 depicting integrated circuit devices are not meant to be actual plan or cross-sectional views of any particular portion of an actual integrated circuit device. In the actual devices, the layers will not be as regular and the thicknesses may have different proportions. In particular, the relative thickness of the layers, such as the layers of the capacitors and transistors, cannot be actually shown, since otherwise some layers, such as the gate insulating layers in FETS 240, 350, 450, and 550 (FIGS. 13–16), may be too thin to see clearly, and others, such as substrate 302 and passivation layer 342 in wafer 301 (FIG. 12), may be too thick to include on a single sheet of paper. The figures instead show idealized representations which are employed to depict more clearly and fully the features of the invention than would otherwise be possible.

In FIG. 1, there is shown a cross-sectional view of an integrated circuit capacitor 50 containing a thin film metal oxide 56 in accordance with the invention. While we shall discuss capacitor 50 in terms of an integrated circuit, it should be understood that capacitor 50 can also represent a bypass capacitor in a MMIC. Integrated circuit capacitor 50 is preferably formed on a wafer 51 that may be silicon, gallium arsenide, ruby or other semiconductor, or an insulator, such as glass or magnesium oxide (MgO). In the preferred embodiments described herein, it is a P-type silicon wafer of about 15 to 20 centimeters in diameter. Preferably, it is a single crystal. Layer 52 of about 500 nm of silicon dioxide is grown on silicon wafer 51 by conventional methods. Then, first electrode 53 is formed by first sputtering 20 nm of titanium layer 54 followed by 200 nm of platinum layer 55. As is known in the art, the titanium assists in adhering platinum layer 55 to oxide layer 52. The incomplete device is then annealed in an oxygen furnace, preferably for 30 minutes at 650° C. The annealing in oxygen serves, among other things, to stabilize the titanium in titanium layer 54. Next, thin film 56 of metal oxide is formed on substrate 64, as will be described in detail below. Then second electrode 63 is formed, preferably by sputtering another 200 nm thick layer of platinum. Further details of the capacitor formation process will be described below.

Figure 2:
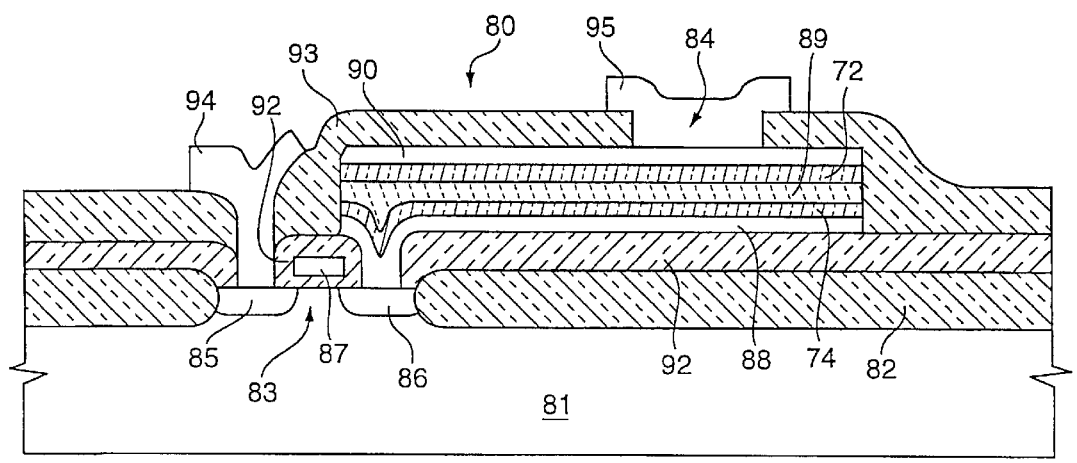
FIG. 2 is a cross-sectional view of a DRAM cell in which the integrated circuit capacitor of FIG. 1 may be incorporated.

A charge storage cell 80 in which the invention may be used is shown in FIG. 2. Cell 80 is formed on a silicon substrate 81, and includes field oxide areas 82, and two electrically interconnected electrical devices, a transistor 83, and a capacitor 84. Transistor 83 includes a source 85, a drain 86, a gate 87, and a gate dielectric 92. Capacitor 84 includes first or bottom electrode 88, thin film capacitor material 89, and second or top electrode 9O. Optional buffer layers 72 and 74 sandwich capacitor material 89. First electrode 88 is shown as a single element because of the scale of the drawing, though it should be understood that it will usually comprise two or more different layers, as discussed with respect to electrode 53 of FIG. 1, above. Interlayer dielectrics, such as 93, separate devices 83 and 84, except where drain 86 of transistor 83 is connected to first electrode 88 of capacitor 84 Electrical contacts, such as 94 and 95, make electrical connection to devices 83 and 84 and to other parts of integrated circuit 91 If layer 89 is a high dielectric constant material, integrated circuit charge storage device 80 is a DRAM cell; if layer 89 is a ferroelectric, then device 80 is a FERAM cell. The non-ferroelectric high dielectric constant materials of the invention may be used as gate dielectric 92, either of buffer layers 72 and 74, capacitor dielectric material 89, or interlayer dielectric 93 The ferroelectric materials of the invention may be used as capacitor material 89

Figure 3:
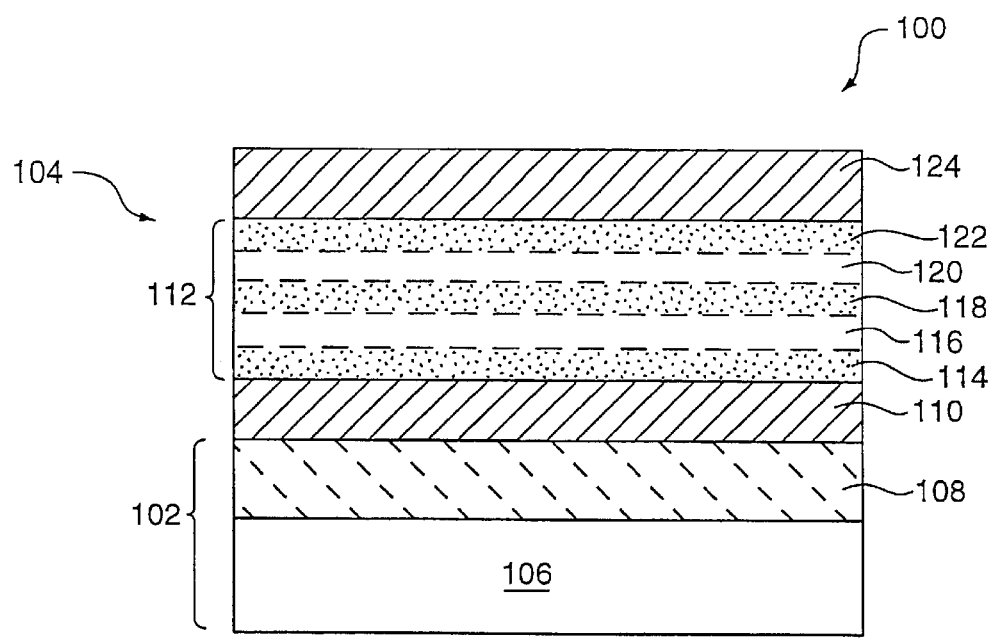
FIG. 3 depicts an integrated circuit device in which a thin film of metal oxide comprises a virtual stacked structure combining alternating layers of metal oxide and bismuth oxide.

FIG. 3 depicts a metal oxide device 100 including a substrate 102 supporting dielectric capacitor 104 Thin film 112 of metal oxide is a virtual stacked structure combining alternating layers 114, 118 and 122 of metal oxide and layers 116, 120 of bismuth oxide.

Substrate 102 includes semiconducting wafer 106, preferably silicon, and insulating layer 108, preferably of silicon dioxide. Capacitor 104 contains metal bottom electrode 110 The metal bottom electrode structure can be any metal or electrode structure suitable for use in integrated circuits, e.g., aluminum, gold, ruthenium, rhodium, and palladium. As discussed in reference to FIG. 1, bottom electrode 110 is preferably made of a combination of platinum sublayer and a titanium sublayer (not shown separately in FIG. 3) where titanium functions as an adhesion metal to prevent peeling of the platinum component away from the oxide layer. Tantalum, iridium and iridium oxide are also useful as adhesion metals. The titanium or other adhesion metal is typically sputtered to a thickness ranging from 10 nm to 20 nm. The platinum preferably ranges from 100 nm to 200 nm thick. The metal layers of bottom electrode 110 are formed by conventional atomic sputtering techniques, such as DC magnetron sputtering or radio frequency sputtering.

A thin film 112 of metal oxide in accordance with the invention is located on bottom electrode 110 Layer 112 is preferably less than about 400 nm thick, and most preferably less than about 200 nm thick. Thin film 112 is a virtual stacked structure in which layers 114, 118 and 122 of metal oxide alternate with layers 116, 120 of bismuth oxide. Thin film 112 is typically formed by applying a single type of precursor to the substrate and treating the precursor so that the layered structure of thin film 112 spontaneously forms upon treating. The dashed lines between layers 114, 116, 118, 120 and 122 signify that these layers are not formed separately, but rather form spontaneously as integrated parts of a single, interconnected chemical compound structure.

FIG. 4 depicts a metal oxide device 140 including a substrate 102 supporting dielectric capacitor 144 including a thin film metal oxide 152 Thin film 152 is an actual stacked structure. Thin film 152 comprises distinct layers that are separately formed and then typically annealed together. Layers 150, 154 and 158 comprise metal oxide and alternate with bismuth oxide layers 152 and 156 The solid lines between layers 150, 152, 154, 156 and 158 signify separate, distinct layers of material that are individually deposited. Each solid line between the alternating layers of the thin film represents an interface between the alternating types of layers; however, it is clear that there may be some interdiffusion or bonding of atoms between adjacent layers so that the interface may not be clearly defined. The term "interface" in this disclosure has its usual meaning and refers to the area of physical contact of a surface of one distinct layer with the surface of an adjacent distinct layer.

Terms of orientation, such as "top", "upper", "below", "bottom", and "lower" herein mean relative to semiconductor substrate 51, 81, 106, 302 and 402 in FIGS. 1–4 and 12–16, respectively. That is, if a second element is "above" a first element, it means it is farther from the semiconductor substrate; and if it is "below" another element, then it is closer to the semiconductor substrate than the other element. The long dimension of semiconductor substrate 51, 81, 106, 302 and 402 defines a plane that is considered to be a "horizontal" plane herein, and directions perpendicular to this plane are considered to be "vertical". The terms "over" and "directly over" are used synonymously when at least a portion of a particular layer is vertically straight above at least a portion of another layer. For example, in FIG. 1, top electrode 63 is directly over silicon dioxide film 52 The terms "over" and "directly over" do not mean that the particular layer is in direct contact with an underlying layer. For example, metal oxide film 56 typically does not contact the top surface of semiconductor substrate 51, but it is above it. The term "on" is often used in the specification when referring to the deposition or formation of an integrated circuit layer directly onto an underlying substrate or layer. In contrast to "over" and "directly over", the terms "on" and "onto" generally signify direct contact, as is clear in the various contexts in which they are used.

The term "thin film" herein means a thin film of a thickness appropriate to be used in an integrated circuit. Such thin films are less than 1 micron in thickness, and generally are in the range of 1 nanometer (nm) to 500 nm. It is important to distinguish this term from the same term, i.e., "thin film," as used in essentially macroscopic arts, such as optics, where "thin film" means a film over 1 micron, and usually from 2 to 100 microns. Such macroscopic "thin films" are hundreds to thousands of times thicker than integrated circuit "thin films", and are made by entirely different processes that generally produce cracks, pores and other imperfections that would be ruinous to an integrated circuit but are of no consequence in optics and other macroscopic arts.

Figure 5:
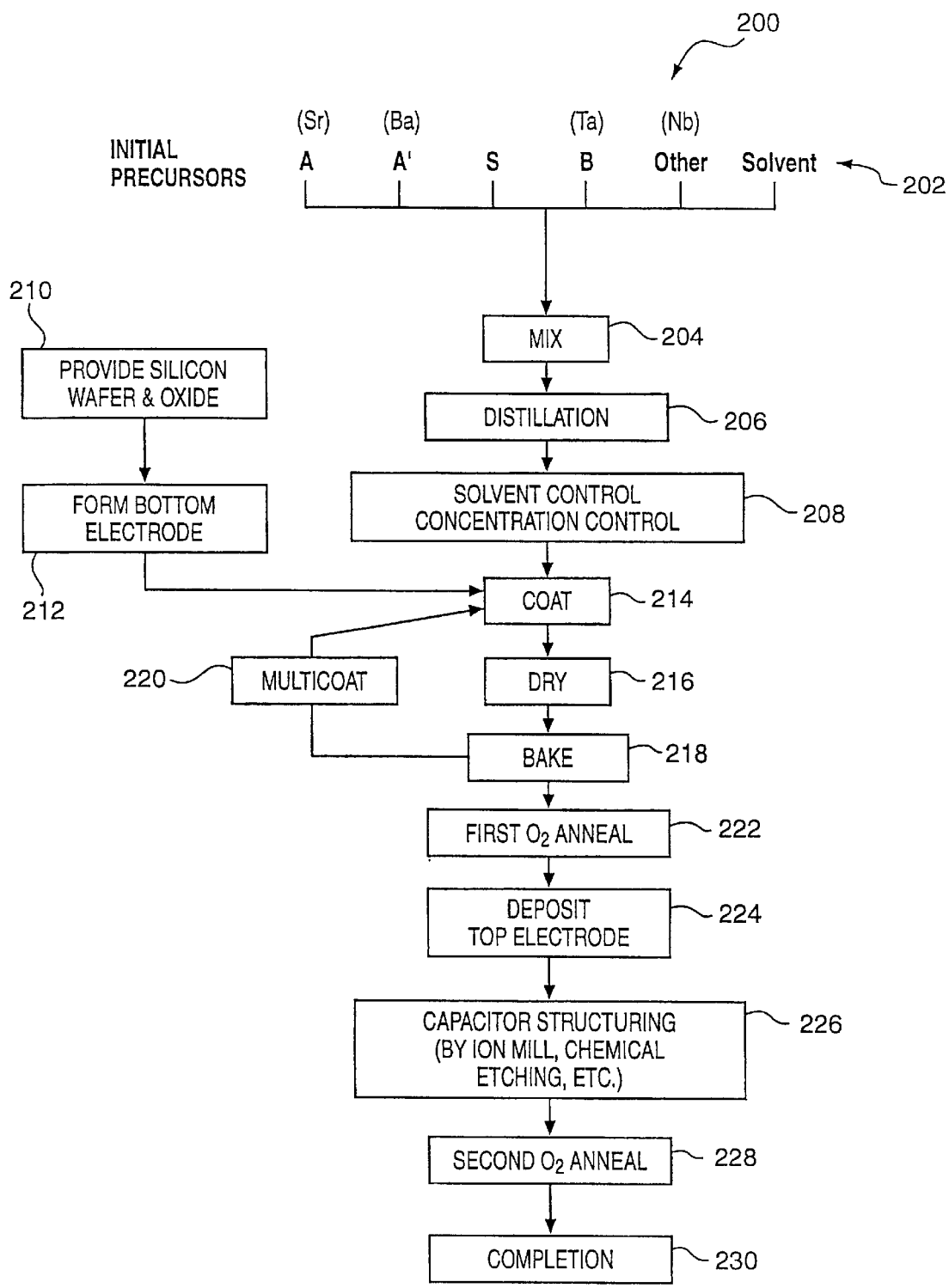
FIG. 5 is a flow chart showing the preferred embodiment of a process for forming a capacitor containing a thin film of metal oxide according to the invention.

In FIG. 5 is shown the flowsheet of generalized preferred process 200 for fabricating a thin film of metal oxide 56, 89, 112 according to the invention in memory capacitor 50, 84, 104 of an integrated circuit. The process begins with the formation of a precursor solution, in steps 202 through 208, and the preparation, in steps 210 and 212, of substrate 64, 88, 104 to which the precursor solution is to be applied. Both the words "substrate" and "precursor" are used ambiguously in the art. The word "substrate" can mean underlying wafer 51, 81, 106, 302 and 402 on which the integrated circuit is formed, as well as any object on which a thin film layer is deposited. In this disclosure, "substrate" shall mean the object to which the layer of interest is applied; for example, when we are talking about a metal oxide layer, such as 56, substrate 64 includes layers 51, 52, 54 and 55 on which metal layer 56 is formed, unless the context indicates otherwise. In contrast, the term "semiconductor substrate" herein means the initial semiconductor wafer material, usually silicon, and its doped regions. Thus, the term "semiconductor substrate" refers to layers 51, 81, 106, 302, and 402 In the art, the word "precursor" can mean a solution containing one metal which is mixed with other "precursors" to form the solution to be applied to the substrate, or the solution which is applied to a substrate. In this discussion, we shall generally refer to the individual precursors that are mixed to form the solution that is applied to the substrate as "initial precursors" and the precursor as applied to the substrate as the "final precursor" or just "precursor".

General methods for making precursors of metal oxides are described in U.S. Pat. No. 5,559,260, issued Sep. 24, 1996 to Scott et al., which is hereby incorporated as if fully contained herein. Methods for fabricating thin films of perovskite metal oxides are described in U.S. Pat. No. 5,624,707, issued Apr. 29, 1997 to Azuma et al., which is hereby incorporated as if fully contained herein.

In step 202 of FIG. 5, initial precursors for the A-site, S-site (if appropriate), and B-site atoms are prepared. As shown in FIG. 5, the A-site precursors may include precursors for element A-atoms or element A'-atoms or both, depending on the desired composition of metal oxide. The symbol B of FIG. 5 indicates an initial precursor for element B-atoms. The designation "other" may signify one or more B"-atom precursors, or one or more S-site precursors, or one or more A-site precursors, or a dopant, as described in U.S. Pat. No. 5,624,707, issued Apr. 29, 1997 to Azuma et al. In step 202 of FIG. 5, the elements Sr, Ba, Ta, and Nb that correspond to the A, A', Ta, and "other" initial precursor, respectively, for a $(Ba_xSr_{1-x})(Ta_yNb_{1-y})_2O_6$ precursorare shown in parentheses above the initial precursor to which they correspond as an example of a final precursor according to the invention.

Typically, a stock solution for the desired metal oxide of the invention is prepared by mixing the initial precursors of the individual metal elements in step 204 This step may be done just prior to deposition of thin film 56, 89, 112, but is generally done well in advance. The solution preparation steps 202 and 204 are preferably done under an inert atmosphere. A feature of the method of the invention is the use of metal organic deposition ("MOD") precursors and deposition techniques for forming the high dielectric constant insulator thin films according to the invention. Individual MOD precursors are formed by interacting each of the metals of a desired compound, for example, cerium for the barrier layer compound, and strontium and tantalum for the high dielectric compound, or an alkoxide of the metal, with a carboxylic acid, or with a carboxylic acid and an alcohol, and dissolving the reaction product in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, 2-pentanol, 1-hexanol, 2-hexanol, 3-hexanol, 2-ethyl- 1-butanol, 2-ethoxyethanol, and 2-methyl- 1-pentanol, preferably 2-methoxyethanol. Solvents that may be used include xylenes, n-octane, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1, 3, 5 trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl- 1-butanol, 2-ethoxyethanol, and 2-methyl- 1-pentanol, as well as many others.

Preferably, the A-site atoms are strontium and barium, the B-site atoms are tantalum, and the S-site atoms are bismuth. Preferably, the stock solution is prepared by reacting stoichiometric amounts of barium, strontium, bismuth (where appropriate) and tantalum with 2-methoxyethanol and 2-ethylhexanoic acid. Other compounds may be used to form the precursor solution, including alkoxides, carboxylates, 2-ethylhexanoates, neodecanoates, and octanoates of the respective metals.

The precursor prepared in step 204 is preferably the final precursor. However, optionally, the mixture may be further heated to distill it in step 206, or, in step 208, an additional solvent or solvents may be added just before application of the precursor to adjust the concentration to be optimum for the particular thin film to be formed. For example, n-butyl acetate may be added to adjust the viscosity and boiling point, or a solvent exchange step may take place simultaneous with or subsequent to the concentration adjustment. The solvent exchange primarily replaces a solvent that is convenient for manufacturing the stock solution and/or which makes a precursor that stores well, for a solvent that has a viscosity appropriate for the application process, such as the preferred "spin-on" process. An appropriate viscosity herein preferably means a lower viscosity than the stock solution. Preferably, in the solvent exchange, xylene is exchanged for the 2-methoxyethanol solvent of the stock solution. In the xylene exchange, xylene is added to the solution and the solution is heated to about 130° C. while stirring to boil away the other solvents, such as 2-methoxyethanol. The solvent exchange step, while very useful, is not necessary. N-butyl acetate also has been found to be a solvent that works well; thus, the solvent exchange may be an n-butyl acetate exchange. This method of forming the precursor allows extremely accurate amounts of initial precursors to be added to the stock solution, and the thorough stirring in the solvent exchange step, or other mixing step, ensures uniform mixing of the precursor compounds. The use of metalorganic precursors described herein is important because gels are not formed, which gels would tend to impede the mixing and uniform dispersion of the precursor constituents. All liquid chemicals used in making the precursors, such as xylene, n-butyl acetate, and 2-methoxyethanol, are preferably semiconductor grade chemicals, which is a well-known term in the semiconductor art.

The application of the final precursor in step 214 to form a liquid coating on the substrate may be by a misted deposition process as described in U.S. Pat. No. 5,456,945, mentioned above, though dip coating and other methods of applying a liquid to a substrate may be used. Preferably, a spin-on process is used. Preferably, the wafer is spun at a spin rate of between 750 RPM and 6000 RPM for a period of five seconds to one minute, with these parameters depending on the concentration and viscosity of the solution being applied and the desired thickness of the resulting layer. In steps 216–222, the precursor on the substrate is then treated to form a solid thin film of metal oxide. The step of treating may include heating in the form of drying, baking, annealing, or an RTP (rapid thermal process) step. Baking herein means heating at temperatures below the anneal temperature of the material. The RTP step may either be an RTP bake or an RTP anneal. Generally, the treating is by heating, but as described in U.S. Pat. No. 5,456,945, it may alternatively or additionally be treated by exposing the substrate and precursor to a vacuum, or by exposing to ultraviolet radiation. In the preferred embodiment, the precursor is treated by drying in step 216, baking in step 218, and oxygen annealing in step 222 The drying step 216 is done at a temperature of between 100° C. and 500° C. for a time of between 30 seconds and 10 minutes, preferably on a hot plate. Preferably, the drying is done in a plurality of drying substeps, each one at a higher temperature than the previous one. In Examples 1 to 3 below, the drying was done in two substeps, one at 150° C. for one minute and another at 260° C. for four minutes. Bake step 218 may also include a rapid thermal process (RTP) bake or a furnace bake, though in the preferred embodiment it is a hot plate bake. If an RTP step 218 is utilized, it uses a halogen light source to raise the wafer rapidly to a high temperature in the range from 500° C. to 850° C. for a bake time of between 15 seconds and three minutes. Step 222 of annealing is done at a temperature of from 500° C. to 850° C. from 30 minutes to three hours. In Examples 1 to 3 below, the annealing was done at 800° C. for 70 minutes. If a single coat of precursor is applied, drying step 216, baking step 218, and annealing step 222 are performed consecutively. However, usually two or more coats of final precursor are applied. In a multiple coat process 220, drying step 216 and bake step 218 are performed after each application of the precursor, and then the next coat of precursor is applied. Anneal step 222 is preferably performed after all the coats of precursor are applied, but may be performed after each drying.

After the desired number of coats of precursor are applied, dried, baked, and annealed, top electrode 63, 90, 124 is deposited in step 224, preferably by sputtering a layer of platinum. Then, in step 226, the capacitor is patterned in a conventional process, such as ion milling, chemical etching, etc. In the examples below, an ion milling process with a negative mask photolithography was used to delineate capacitors. The resist strip was performed using a standard IPC with 300 watts of RF power for 30 minutes. Then, in step 228, a second oxygen anneal is performed. The second anneal is at a temperature of from 500° C. to 850° C. from 15 minutes to one hour. In Examples 1 to 3 below, the second anneal was done at 800° C. for 30 minutes with a 10 minute push into the furnace and a 10 minute pull out of the furnace. Finally, in step 230, the integrated circuit is completed using conventional processes.

The completed integrated circuit 80 preferably includes at least a portion of the oxide material of the invention, such as dielectric thin film 56, 89, 112, in an active electrical component of the integrated circuit. An active electrical component is a component which actively participates in a function of the circuit; for example, dielectric thin film layer 89 is an active component because it provides the dielectric function of memory capacitor 84, whereas insulator 92 is not active in that it serves only to separate the electrical elements of integrated circuit 80

In DRAMs and bypass capacitors, the value of the voltage coefficient of capacitance, Vcc, should not exceed 10% throughout the operating range. In gate dielectrics, the Vcc value should not exceed 5%. For most integrated circuit applications, the value of the temperature coefficient of capacitance calculated for a temperature range of 20° C. to 140° C. should not exceed 100 ppm; however, in other applications, the value of Tcc is not so critical and values of 1000 or higher are acceptable.

EXAMPLE 1

A series of P-type 100 Si wafer substrates 51 were oxidized to form a layer of silicon dioxide 52 The substrate was dehydrated in a vacuum oven at 180° C. for 30 minutes. An adhesive layer 54 consisting substantially of titanium and having a thickness of 20 nm was sputter-deposited on the substrate, using an argon atmosphere, 8 m Torr pressure and 0.53 amps. Then, under similar sputter conditions, a bottom platinum electrode 55 having a thickness of 300 nm was deposited. Next, the bottom electrodes were pre-annealed at 650° C. for 30 minutes in $O_2$ gas flowing at 6 l/m, using 10 minute push-pull. A dehydration bake was conducted in a vacuum oven at 180° C. for 30 minutes.

A series of 0.25 molar $(Ba_xSr_{1-x})Ta_2$ precursor solutions was prepared in which the stoichiometric amounts of barium and strontium varied, corresponding to values of x between 0.0 and 1.0 in intervals of 0.1. The solutions were diluted to 0.15 molar concentration using n-butyl acetate solvent. On each experimental wafer corresponding to a particular stoichiometry of precursor, a first spincoat of 0.15 molar solution of precursor was deposited on bottom electrode 55 at 1400 rpm for 30 seconds. This was baked using a hot plate for one minute at 150° C., then at 260° C. for four minutes. An RTP-bake was conducted at 725° C. for 30 seconds. The sequence of spin-on, drying and baking was performed a second time. The resulting thin film of solid material was annealed at 800° C. for 70 minutes in $O_2$ gas flowing at 6 l;/m, using 10 minute push-pull, to form a thin film of polycrystalline $(Ba_xSr_{1-x})Ta_2 O_6$ with a thickness in the range of 160 nm to 170 nm. Next, platinum was sputter-deposited to make a top electrode layer 63 with 200 nm thickness. If more than three hours had elapsed between annealing the strontium tantalate thin film and depositing the top electrode, then the wafer was dehydrated in a vacuum oven at 180° C. for 30 minutes before deposition of the top electrode. The platinum and strontium tantalate layers were ion-milled to form the capacitors, and then ashing was performed, followed by a final oxygen anneal for 30 minutes at 800° C. in $O_2$ gas flowing at 6 l/m using a 10 minute push-pull. The individual patterned capacitors typically had a surface area of about 7800 square microns. The film thickness of the thin film of dielectric metal oxide in each of the individual capacitors was in the range of 150 nm to 200 nm. All processes were performed in Colorado Springs, Co.

The resulting material was not ferroelectric. The capacitive and dielectric properties of the thin films of $(Ba_xSr_{1-x})Ta_2O_6$ and the capacitors were measured. The measurements were typically performed on one individual capacitor device selected from each of the eleven different wafers processed. The capacitance was measured in the voltage range from zero to ±5 volts, and the value of Vcc was calculated. Capacitance was also measured over the temperature range of 20° C. to 140° C., and the value of Tcc calculated. The capacitance value of each test capacitor measured at 20° C. was converted to a corresponding value of dielectric constant, $\epsilon_{20}$. The experimental results are presented in Table 1

TABLE 1

| | $(Ba_xSr_{1-x})Ta_2O_6$ | | | | |
|---|---|---|---|---|---|
| Capacitor Number | x (Ba) | 1 − x (Sr) | Tcc ppm | Vcc %, 5 V | $\epsilon_{20}$ |
| 1 | 0.0 | 1.0 | −884 | −0.58 | 92.2 |
| 2 | 0.1 | 0.9 | −860 | −0.50 | 90.6 |
| 3 | 0.2 | 0.8 | −864 | −0.49 | 89.2 |
| 4 | 0.3 | 0.7 | −865 | −0.45 | 88.8 |
| 5 | 0.4 | 0.6 | −877 | −0.46 | 93.5 |
| 6 | 0.5 | 0.5 | −870 | −0.51 | 88.9 |

TABLE 1-continued $(Ba_xSr_{1-x})Ta_2O_6$

| Capacitor Number | x (Ba) | 1 − x (Sr) | Tcc ppm | Vcc %, 5 V | $\epsilon_{20}$ |
|---|---|---|---|---|---|
| 7 | 0.6 | 0.4 | −887 | −0.54 | 93.2 |
| 8 | 0.7 | 0.3 | −710 | −0.40 | 57.4 |
| 9 | 0.8 | 0.2 | −89 | 0 | 39.1 |
| 10 | 0.9 | 0.1 | −91 | 0 | 34.6 |
| 11 | 1.0 | 0.0 | −177 | 0.21 | 46.2 |

In Table 1, the value of Vcc is less than 1% for all values of x. The lowest value of Tcc is about 90 for capacitors 9 and 10, in which x was 0.8–0.9. According to the data in Table 1, the best results with respect to Tcc were achieved when x=0.8 in the precursor for the $(Ba_xSr_{1-x})Ta_2O_6$-material, for which the dielectric constant, $\epsilon_{20}$, had a value of about 40.

Thus, the experimental values of the $(Ba_xSr_{1-x})Ta_2O_6$-material of the invention satisfies the requirements of Vcc and Tcc for 5 volt operation, as well as 3 volt operation. The material showed virtually no dependence on applied voltage. In contrast, in other known high dielectric materials, such as BST, the value of the dielectric constant, $\epsilon$, peaks sharply when the applied voltage approaches zero volts, and the value of & typically decreases 60% and more between zero volts and ±3 volts.

EXAMPLE 2

Experimental capacitors were fabricated according to the method of Example 1, but using precursor solutions for metal oxide material with the stoichiometric formula $(Ba_xSr_{1-x})_2Ta_2O_7$ corresponding to values of x between 0.0 and 1.0 in intervals of 0.1.

Measurements and calculations were made similar to those in Example 1. Again, the material was not ferroelectric. The results are shown in Table 2. The experimental value of Vcc was virtually zero for all values of x. The value of Tcc was about 100 or less for values of x up to about 0.6 Within this range, the value of $\epsilon_{20}$ was a maximum of about 40 at x=0.6 At x=0.9, the value of $\epsilon_{20}$ was about 60, and Tcc was about 180. Thus, the experimental values of the $(Ba_xSr_{1-x})_2Ta_2O_7$-material of the invention satisfy the requirements of Vcc and Tcc for 5 volt operation, as well as 3 volt operation.

TABLE 2

$(Ba_xSr_{1-x})_2Ta_2O_7$

| Capacitor Number | x (Ba) | 1 − x (Sr) | Tcc ppm | Vcc %, 5 V | $\epsilon_{20}$ |
|---|---|---|---|---|---|
| 1 | 0.0 | 1.0 | 0 | 0 | 20.8 |
| 2 | 0.1 | 0.9 | 0 | 0 | 27.2 |
| 3 | 0.2 | 0.8 | 65.1 | 0 | 28.9 |
| 4 | 0.3 | 0.7 | −59.5 | 0 | 34.2 |
| 5 | 0.4 | 0.6 | −58.7 | 0 | 34.1 |
| 6 | 0.5 | 0.5 | −53.4 | 0 | 36.5 |
| 7 | 0.6 | 0.4 | −101 | 0 | 38.7 |
| 8 | 0.7 | 0.3 | −138 | 0 | 42.5 |
| 9 | 0.8 | 0.2 | −172 | 0 | 45.5 |
| 10 | 0.9 | 0.1 | −182 | 0 | 62.7 |
| 11 | 1.0 | 0.0 | 53.4 | 0 | 37.5 |

EXAMPLE 3

Experimental capacitors were fabricated according to the method of Example 1, but using precursor solutions for metal oxide material with the stoichiometric formula $(Ba_xSr_{1-x})_2Bi_2Ta_2O_{10}$ corresponding to values of x between 0.0 and 1.0 in intervals of 0.1. According to the invention, the composition of the liquid precursor and the resulting thin film of metal oxide may be viewed as a combination of the pyrochlore-type oxide $(Ba_xSr_{1-x})_2Ta_2O_7$ and $Bi_2O_3$.

Measurements and calculations were made similar to those in Example 1. The material was not ferroelectric. The results for values of x in the range $0 \leq x \leq 0.7$ are shown in Table 3.

TABLE 3

$(Ba_xSr_{1-x})_2Bi_2Ta_2O_{10.3}$

| Capacitor Number | x (Ba) | 1 − x (Sr) | Tcc ppm | Vcc %, 5 V | $\epsilon_{20}$ |
|---|---|---|---|---|---|
| 1 | 0.0 | 1.0 | 45.3 | 0 | 50.9 |
| 2 | 0.1 | 0.9 | 0 | 0 | 49.4 |
| 3 | 0.2 | 0.8 | 41.3 | 0 | 53.0 |
| 4 | 0.3 | 0.7 | 42.1 | 0 | 52.6 |
| 5 | 0.4 | 0.6 | 38.8 | 0 | 57.0 |
| 6 | 0.5 | 0.5 | 38.1 | 0 | 58.1 |
| 7 | 0.6 | 0.4 | 74.1 | 0 | 59.4 |
| 8 | 0.7 | 0.3 | 105 | 0 | 64.4 |

The experimental value of Vcc was virtually zero for all values of x. The value of Tcc was about 100 or less for all values of x up to about 0.8. Within this range, the value of $\epsilon_{20}$ was a maximum of about 60 at $0.4 \leq x \leq 0.8$. Thus, the experimental values of the $(Ba_xSr_{1-x})_2Bi_2Ta_2O_{10}$-material of the invention satisfies the requirements of Vcc and Tcc for 5 volt operation, as well as 3 volt operation. There was a large jump in the Tcc-value at about x=0.6. Therefore, if a low value of Tcc is critical, the preferred value of x based on the experimental data in Table 1 is $0 \leq x \leq 0.6$. At x≈0.4–0.5, Tcc is about 40 ppm, and the value of 20 is about 60. The value of $\epsilon_{20}$ of about 60 is 50% higher than the maximum values measured in Examples 1 and 2 for Tcc≦100, and it is several times higher than the dielectric constants of conventional dielectric materials used in integrated circuits.

EXAMPLE 4

A series of P-type 100 Si wafer substrates 51 were oxidized to form a layer of silicon dioxide 52 The substrate was dehydrated in a vacuum oven at 180° C. for 30 minutes. An adhesive layer 54 consisting substantially of titanium and having a thickness of 200 Å was sputter-deposited on the substrate, using an argon atmosphere, 8 m Torr pressure and 0.53 amps. Then, under similar sputterm conditions, a bottom platinum electrode 55 having a thickness of 3000 Å was deposited. Next, the bottom electrodes were pre-annealed at 650° C. for 30 minutes in $O_2$ gas flowing at 5 l/m, using 10 minute push-pull. A dehydration bake was conducted in a vacuum oven at 180° C. for 30 minutes. A 0.25 molar $SrTa_2$ precursor solution was diluted to 0.15 molar concentration using n-butyl acetate solvent. A first spincoat of 0.15 molar solution of the strontium tantalum precursor was deposited on bottom electrode 55 at 2000 rpm for 30 seconds. This was baked using a hot plate for one minute at 160° C., then at 260° C. for four minutes. When this sequence of the spincoat and bake steps was repeated for a second spincoat, the thickness of the resulting thin films of solid material on the different wafers varied from wafer to wafer in the range from 500 Å to 950 Å. If only a single coat was applied, then the film thicknesses were about 300 Å. Three or four spin-on coats were applied to achieve film thicknesses of about 2000 Å. After the desired film thickness was achieved, the thin film of solid material was annealed at 800° C. for 60 minutes in $O_2$ gas flowing at 5 l/m, using 10 minute push-pull, to form a thin film of polycrystalline $SrTa_2O_6$. Next, platinum was sputter-deposited to make a top electrode layer 63 with 2000 Å thickness. If more than three hours had elapsed between annealing the strontium tantalate thin film and depositing the top electrode, then the wafer was dehydrated in a vacuum oven at 180° C. for 30 minutes before deposition of the top electrode. The platinum and strontium tantalate layers were ion-milled to form the capacitors, and then ashing was performed, followed by a final oxygen anneal for 30 minutes at 800° C. in $O_2$ gas flowing at 5 l/m using 10 minute push-pull. The individual patterned capacitors typically had a surface area of about 8000 square microns. All processes were performed in Colorado Springs, Co.

The capacitive and dielectric properties of the thin films of $SrTa_2O_6$ and the capacitors were measured. The materials were not ferroelectric. The measurements were typically performed on about 20 individual devices selected from about five different wafers. Representative results are presented in FIGS. 6–11.

Figure 6:
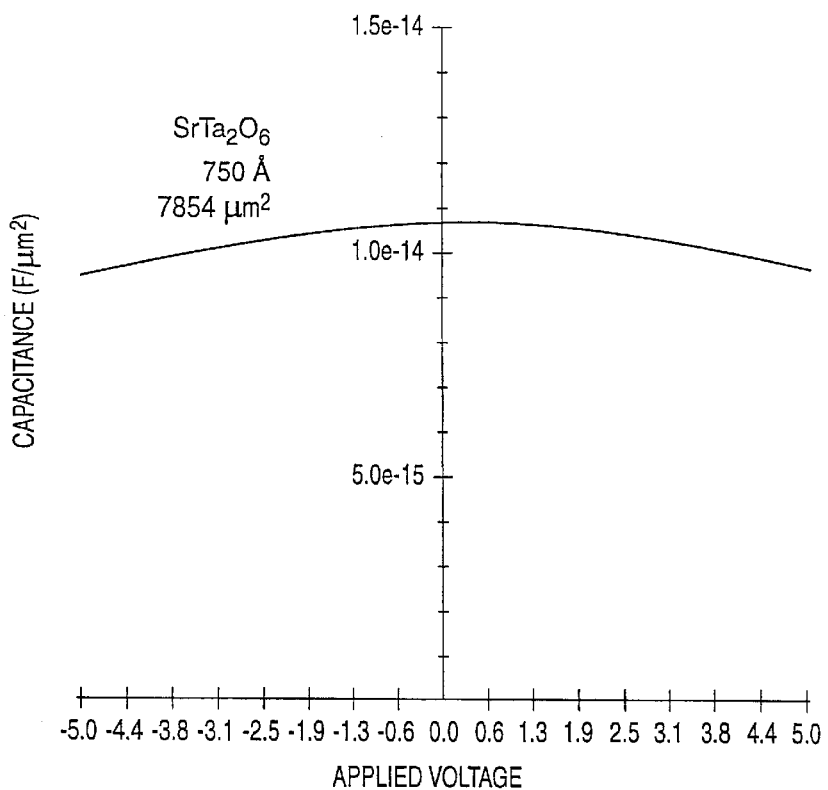
FIG. 6 is a graph of the measured capacitance, in units of $F/\mu m^2$, versus applied voltage for a $SrTa_2O_6$ capacitor according to the invention made by the process of Example 4.

FIG. 6 is a graph of the measured capacitance, $F/\mu m^2$, as a function of applied voltage for a $SrTa_2O_6$ capacitor according to the invention made by the exemplary process described above. The capacitance was measured in the voltage range from zero to about ±5 volts. The capacitor had an area of 7854 $\mu m^2$, and the $SrTa_2O_6$ thin film had a thickness of 750 Å. The almost flat curve indicates virtually no influence of voltage on capacitance over the range of operating voltages in a typical integrated circuit. In gate dielectrics, the voltage coefficient of capacitance, $V_{cc}$, should not exceed 5%. In DRAMs and bypass capacitors, the $V_{cc}$ value should not exceed 10% throughout the operating range. Thus, the $SrTa_2O_6$-material of the invention satisfies these requirements for 3 volt operation. In contrast, even the best of previously known high dielectric materials, such as BST, the capacitance (and $\epsilon_r$ value) peaks sharply when the applied voltage approaches zero volts, and the capacitance value (and $\epsilon_r$ value) typically decreases 60% and more between zero volts and ±3 volts.

Figure 7:
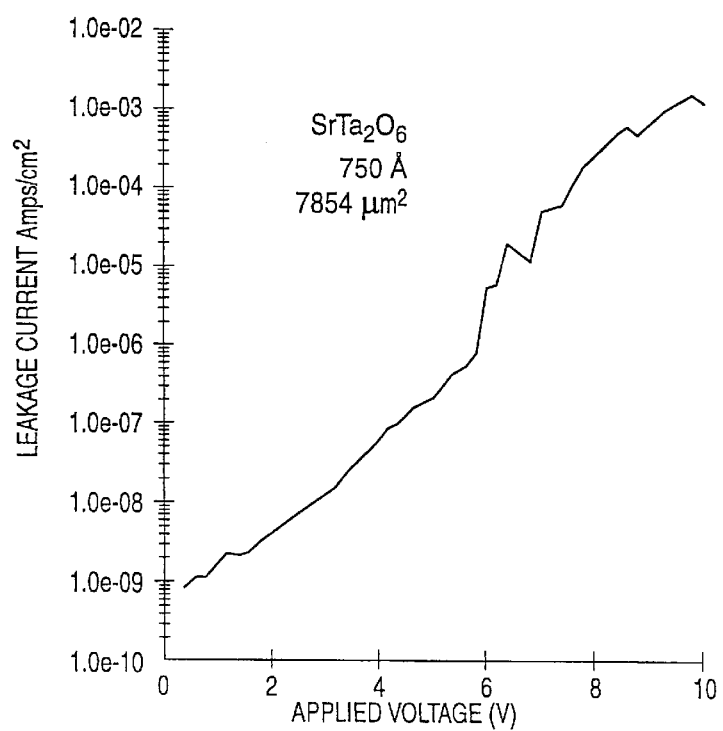
FIG. 7 is a graph of the measured leakage current versus applied voltage for the capacitor of FIG. 6.

FIG. 7 is a graph of the measured leakage current versus applied voltage in the same capacitor sample from which the data of FIG. 6 was obtained. It shows a leakage current of about $10^{-8}$ amps/cm$^2$ or less over the normal range of operating voltages in an integrated circuit device; that is, ±3 volts. These values are at least an order of magnitude (i.e., a factor of 10) lower than leakage currents in nonlinear dielectrics, such as BST or PZT.

Figure 8:
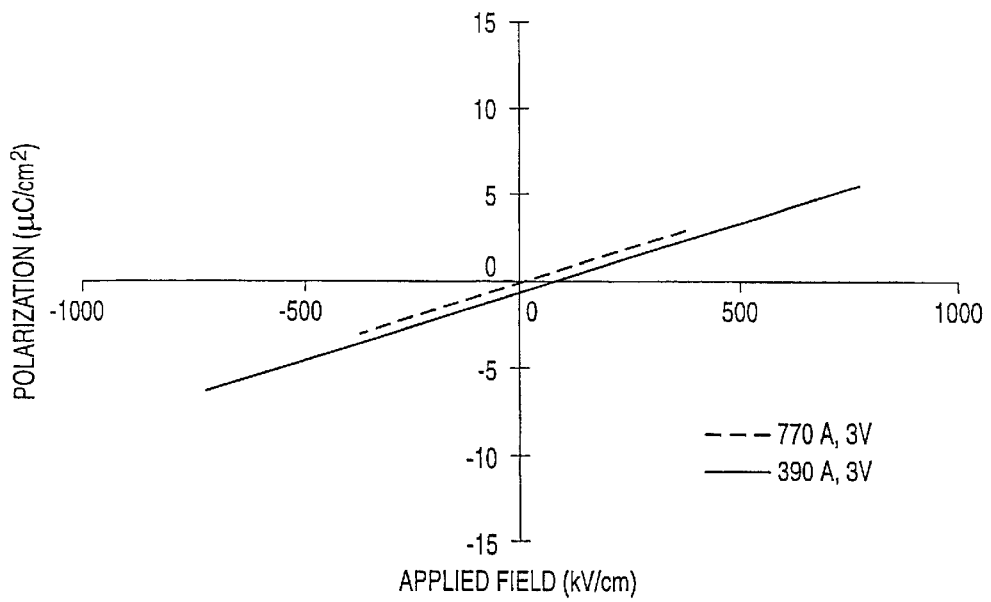
FIG. 8 is a graph of the polarization value, in $\mu C/cm^2$, plotted versus applied field, in kV/cm, in $SrTa_2O_6$ capacitors with different thicknesses, made by the process of Example 4.

FIG. 8 is a graph of the polarization value, in units $\mu C/cm^2$, versus applied field, in kV/cm, in $SrTa_2O_6$ capacitors, one with a thickness of 390 Å, the other with a thickness of 770 Å. The graph shows a desired linear dependence of the polarization of the dielectric on applied field; it also shows virtually no dependence of polarization on film thickness.

Figure 9:
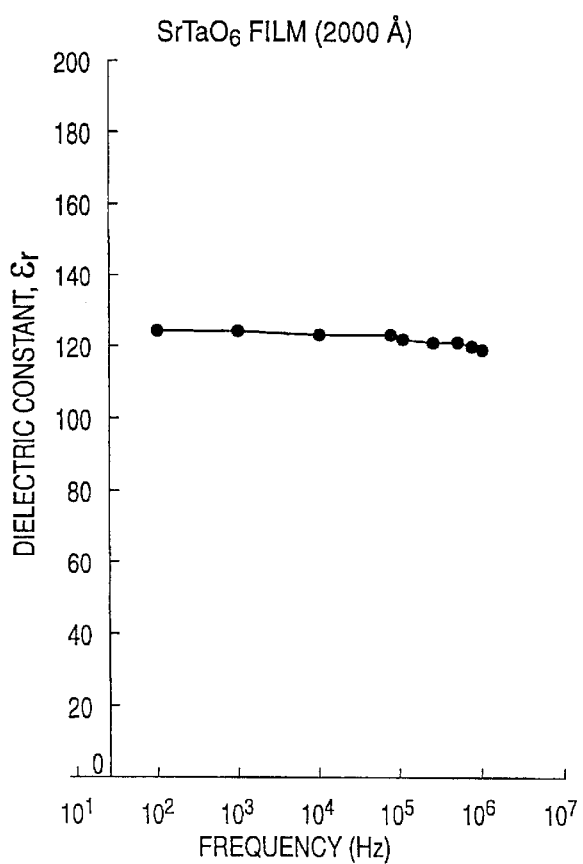
FIG. 9 is a graph of relative dielectric constant, $\epsilon_r$, versus frequency measured in a $SrTa_2O_6$ thin film with a thickness of 2000 Å, made by the process of Example 4.

FIG. 9 is a graph of relative dielectric constant, $\epsilon_r$, versus frequency measured in a $SrTa_2O_6$ thin film with a thickness of 2000 Å. It shows that the dielectric constant is virtually independent of frequency out to $10^6$ Hz, which is beyond the normal range of operating frequencies of an integrated circuit. It also shows that the dielectric constant consistently exceeds a value of 100 .

Figure 10:
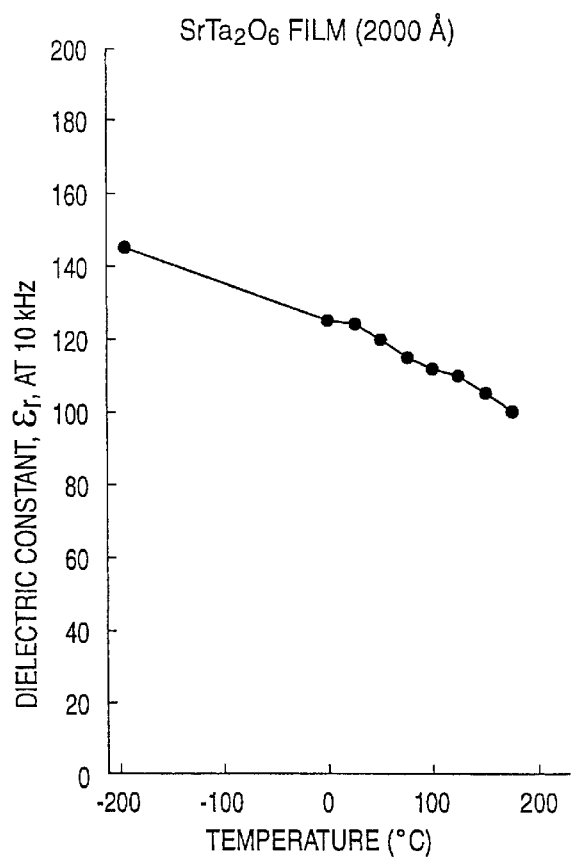
FIG. 10 is a graph of the relative dielectric constant, $\epsilon_r$, versus temperature measured at 10 kHz in a $SrTa_2O_6$ thin film with a thickness of 2000 Å, made by the process of Example 4.

FIG. 10 is a graph of the relative dielectric constant, $\epsilon_r$, versus temperature measured at 10 kHz in a $SrTa_2O_6$ thin film with a thickness of 2000 Å. It indicates that the dielectric constant decreases as temperature increases; however, it also shows that the dielectric constant exceeds 100 beyond the extreme operating temperature of 150° C. Moreover, in the temperature range of 50° C. to 100° C. associated with normal operating conditions of an integrated circuit, the variation of $\epsilon_r$ with temperature is less than 10%.

Figure 11:
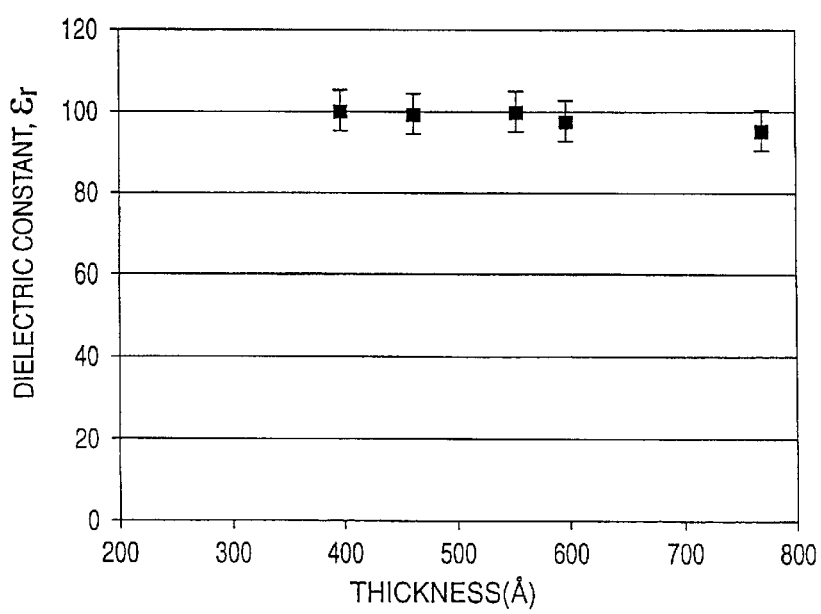
FIG. 11 is a graph of the relative dielectric constant, $\epsilon_r$, versus thickness in angstrom units for a $SrTa_2O_6$ capacitor according to the invention made by the process of Example 4.

FIG. 11 is a graph of the relative dielectric constant, $\epsilon_r$, versus thickness in angstrom units for a $SrTa_2O_6$ capacitor. The graph shows little dependence of dielectric constant on film thickness, and thereby indicates that excellent potential for thickness scaling of the dielectric thin film.

EXAMPLE 5

Experimental capacitors and dielectric thin films containing dielectric metal oxide in place of or in addition to $SrTa_2O_6$ were fabricated according to the method of Example 4. The thin films contained dielectric metal oxides with a chemical composition represented by the general stoichiometric formula $AB_2O_6$, wherein A represents at least one of strontium and barium, and B represents at least one of tantalum and niobium. Thus, thin films were made from precursors for the following dielectric metal oxides: $SrTa_2O_6$, $SrNb_2O_8$, $BaTa_2O_6$ and $BaNb_2O_6$. The thin films fabricated and tested comprised both material containing only one particular type of metal oxide compound, such as $SrNb_2O_6$, and also solid solutions of a plurality of chemical species. In particular, thin films of the following single-compound metal oxides were formed and tested: $SrTa_2O_6$, $SrNb_2O_6$, $BaTa_2O_6$ and $BaNb_2O_6$. Also, thin films comprising a solid solution of metal oxides represented by the following formulas were formed and tested: $(Sr_xBa_{1-x})Nb_2O_6$, where $0.25 \leq x \leq 0.75$; and $Sr(Ta_yNb_{1-y})_2O_6$, where $0 \leq x \leq 1$. In fabrication of the experimental wafers, the values of the formula subscripts x and y in the preceding formulas was varied by 0.2 over the ranges indicated. As in Example 4, the initial precursor solutions for each metal oxide were 0.25 molar concentration; for example, a 0.25 molar solution of $BaTa_2$. Single-species final precursors were prepared by diluting with n-butyl acetate, as in Example 4. Final precursors for solid-solution thin films were prepared by mixing a plurality of initial precursors, and adding solvent if necessary. Several capacitors were fabricated and tested for each composition indicated.

The dielectric thin films in the capacitors containing some or all non-$SrTa_2O_6$ material had lower relative dielectric constants, $\epsilon_r$, than measured for $SrTa_2O_6$-only dielectric material. The values of the measured relative dielectric constants, $\epsilon_r$, were typically in the range of 30–70. Nevertheless, and very importantly, the dielectric thin films and capacitors exhibited other properties similar to $SrTa_2O_6$. That is, the effects of applied voltage, frequency, temperature and thickness on the materials of Example 5 were similar to the effects of these factors on $SrTa_2O_6$ in Example 4. Therefore, although the dielectric and capacitive values of thin films containing non-$SrTa_2O_6$ material are lower than $SrTa_2O_6$-only material, their favorable dependence on operating variables also makes them suitable for use in integrated circuits.

Figure 12:
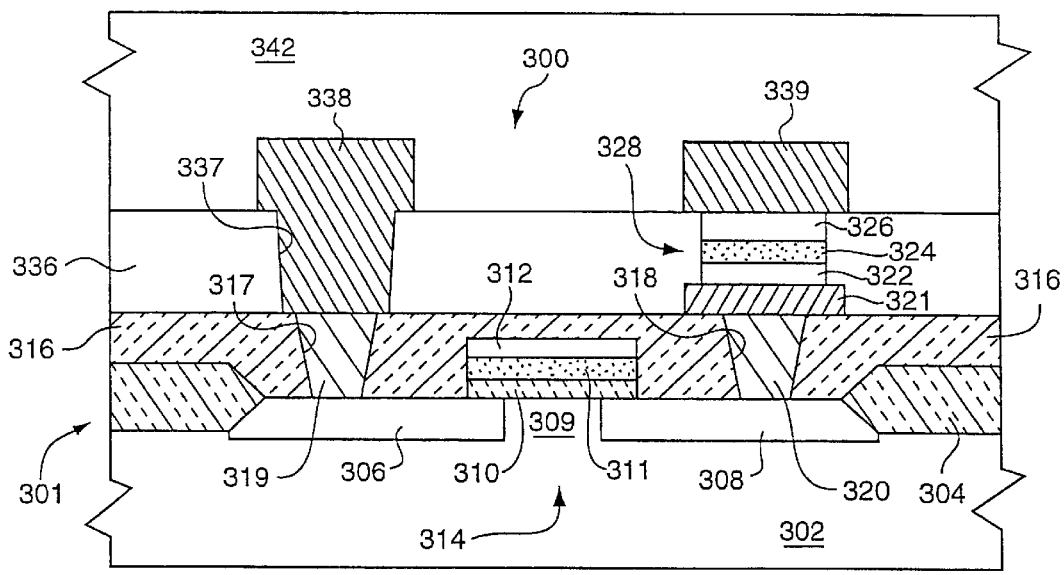
FIG. 12 is a cross-sectional view of a DRAM memory cell containing both a high dielectric constant gate insulator in a FET with a nonconductive diffusion barrier layer according to the invention, and a memory capacitor having a high dielectric constant insulator between its electrodes and a conductive diffusion barrier layer between its bottom electrode and the semiconductor substrate.

FIG. 12 shows a DRAM memory cell 300 in which the material according to the invention is used as a gate electrode. DRAM memory cell 300 includes transistor 314 and capacitor 328 formed on a wafer 301 including semiconductor substrate 302 Semiconductor substrate 302 may comprise silicon, gallium arsenide, silicon germanium, or other semiconductor, and may also include other substrate materials such as ruby, glass or magnesium oxide. In the preferred embodiment, it is silicon. field oxide region 304 is formed on a surface of semiconductor substrate 302 Semiconductor substrate 302 comprises a highly doped source region 306 and a highly doped drain region 308, which are formed about a doped channel region 309. Doped source region 306, drain region 308 and channel region 309 are preferably n-type doped regions. Buffer/diffusion barrier layer 310 comprising a thin film of electrically nonconductive material according to the invention is located on semiconductor substrate 302, above channel region 309 Buffer/diffusion barrier layer 310 has a thickness in the range of from 1 nm to 30 nm, preferably 1 nm to 5 nm. A gate insulator 311 comprising a thin film of high dielectric constant insulator according to the invention is located on buffer/diffusion barrier layer 310. Further, a gate electrode 312 is located on gate insulator 311. Gate insulator 311 has a thickness in the range of from 1 nm to 50 nm, preferably from 5 nm to 20 nm. These source region 306, drain region 308, channel region 309, buffer/diffusion barrier layer 310, gate insulator 311 and gate electrode 312 together form a MOSFET 314

A first interlayer dielectric ("ILD") layer 316, preferably made of BPSG (boron-doped phospho-silicate glass) is located on semiconductor substrate 302 and field oxide region 304 ILD 316 is patterned to form vias 317, 318 to source region 306 and drain region 308, respectively. Vias 317, 318 are filled to form plugs 319, 320, respectively. Plugs 319, 320 are electrically conductive and typically comprise polycrystalline silicon or tungsten. An electrically conductive buffer/diffusion barrier layer 321 according to the invention is located on ILD 316 in electrical contact with plug 320. Diffusion barrier layer 321 is made of, for example, $IrO_2$ and typically has a thickness of from 1 nm to 30 nm, preferably from 1 nm to 5 nm.

As depicted in FIG. 12, a bottom electrode layer 322 is located on diffusion barrier layer 321. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a dielectric or ferroelectric memory. In the preferred embodiment, bottom electrode 322 is made of platinum and has a thickness of 100 nm. Preferably, it also includes at least one adhesive layer (not shown), such as titanium, to enhance the adhesion of the electrodes to adjacent underlying or overlying layers of the circuits. Capacitor dielectric 324, comprising a thin film of high dielectric constant insulator according to the invention, is located on bottom electrode layer 322. Capacitor dielectric 324 has a thickness in the range of from 5 nm to 500 nm, preferably from 30 nm to 100 nm. A top electrode layer 326, made of platinum and having a thickness of 100 nm, is formed on capacitor dielectric 324 Bottom electrode layer 322, thin film capacitor dielectric 324 and top electrode layer 326 together form memory capacitor 328. Diffusion barrier layer 321 inhibits the diffusion of metal atoms and oxygen from capacitor dielectric 324 and bottom electrode 322 into the semiconductor substrate. A second interlayer dielectric layer (ILD) 336 made of NSG (nondoped silicate glass) is deposited to cover ILD 316, buffer/diffusion barrier layer 321, and dielectric memory capacitor 328. A PSG (phospho-silicate glass) film or a BPSG (boron phospho-silicate glass) film could also be used in layer 336. ILD 316 and ILD 336 may also be made of the metal oxide material according to the invention. ILD 336 is patterned to form via 337 to plug 319 A metallized wiring film is deposited to cover ILD 336 and fill via 337 and then patterned to form source electrode wiring 338 and top electrode wiring 339. Wirings 338, 339 preferably comprise Al—Si—Cu standard interconnect metal with a thickness of about 200 nm to 300 nm.

FIG. 12 depicts only one of many variations of dielectric memory cells that can be fabricated using the method of the invention. The shown structure in which capacitor 328 is stacked on top of ILD 336 and thus separated from transistor 314 is conventionally called a "stacked capacitor" structure. The capacitor can also be formed in the contact hole to drain 308, as shown for example in U.S. Pat. No. 5,466,629 issued on Nov. 14, 1995 to Mihara et al., which is incorporated herein by reference to the same extent as though fully disclosed herein. The inventive composition and structure may also be used to form a gate insulator in the FET of a nonvolatile ferroelectric FET memory cell. FIGS. 13–16 illustrate some alternatives of this embodiment.

Figure 13:
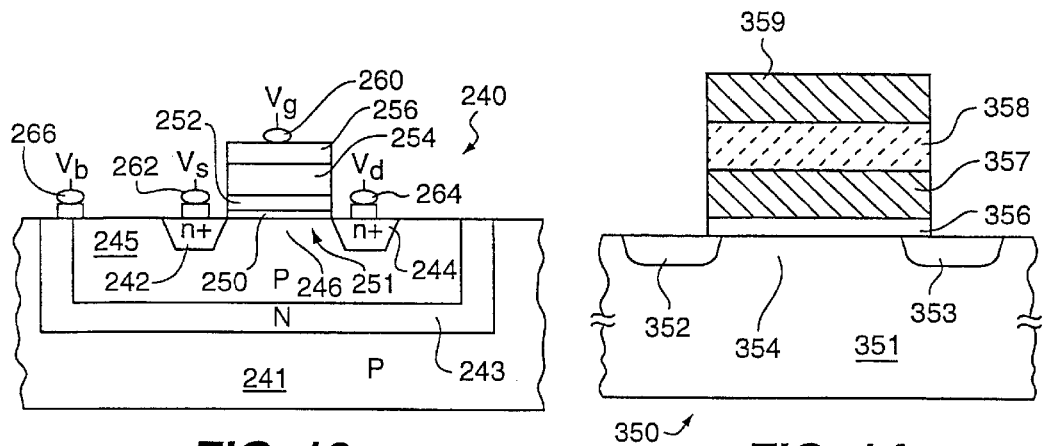
FIG. 13 shows a cross-sectional view of a preferred embodiment of a ferroelectric FET according to the invention illustrating the various electrical contacts associated with the FET.

FIG. 13 shows a cross-sectional view of a portion of a ferroelectric FET 240 according to the invention. The FET 240 includes a substrate 241 which is preferably p-type silicon. A deep n-well 243 is formed in substrate 241, and a less deep p-well 245 is formed within the n-well. Highly doped areas 242 and 244, preferably n-type, are formed in p-well 245 We shall refer to these doped areas 242 and 244 herein as source/drains since they can either be a source or a drain depending on the relative voltages applied to the areas. A channel region 246, preferably also n-type but not as highly doped as source/drains 242 and 244, is formed between the source/drains 242 and 244 An insulating layer 251 is preferably formed on substrate 241 above channel region 246 In the preferred embodiment, insulating layer 251 comprises layers 250 and 252, each of which is a different insulator, and at least one of which comprises a material according to the invention. A ferroelectric layer 254 is formed above channel 246, preferably on insulator 252, and a gate electrode 256 is formed on ferroelectric 254 Wiring layers form electrical contacts 260, 262, 264 and 266 to gate 256, source/drain 242, source/drain 264, and substrate 241, respectively. Contact 266 is preferably located over the junction between deep n-well 243 and p-well 245 The fabrication and function of FET 240 is described in detail in copending U.S. patent application Ser. No. 09/329,670 filed Jun. 10, 1999 by Lim et al., which is hereby incorporated by reference to the same extent as though fully disclosed herein.

Figure 14:
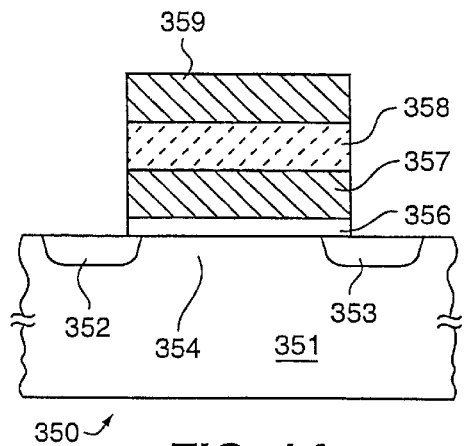
FIG. 14 is a cross-sectional view of a MFM/SFET according to the invention.
Figure 15:
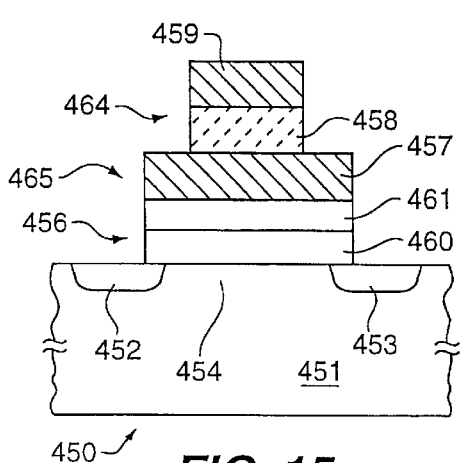
FIG. 15 is a cross-sectional view of a FET according to the invention in which the MIS portion of the FET has a larger area than the MFM portion of the FET.
Figure 16:
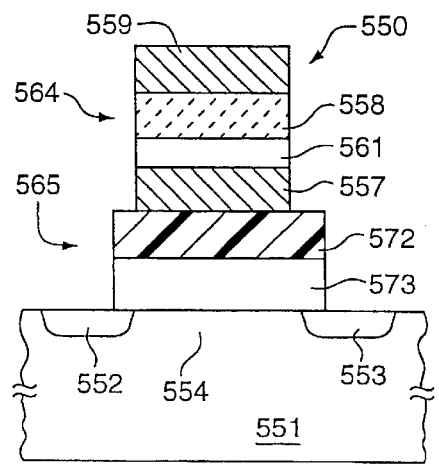
FIG. 16 is a cross-sectional view of another FET according to the invention that illustrates one of the many variety of forms a FET according to the invention can take.

FIGS. 14–16 illustrate various ferroelectric FET gate configurations. The details of the substrate architecture is not shown in these FIGS. In the preferred embodiment, the substrate architecture would include deep—and p-wells as shown in FIG. 1. However, these gate configurations can be combined with the substrate configuration shown in FIG. 13, any of the different substrate and memory configurations discussed in U.S. patent application Ser. No. 09/329,670, or many other substrate and memory configurations that are known or become available in the art. FIG. 14 shows a MFM/SFET which can also serve as the FET to implement the invention. This FET is again formed on a semiconductor 351, and includes source/drains 352 and 353, channel 354, insulating layer 356, ferroelectric 358, and electrode 359, but also includes a floating gate electrode 357. Insulating layer 356 can be a single insulating layer or multiple insulating layers as discussed above and below. Contacts, wiring layers and other architecture can take on any of the forms shown or discussed above.

FIG. 15 shows a MFM/SFET 450 similar to the MFM/SFET 350 of FIG. 14, except that insulating layer 456 includes a barrier layer 461 and an insulator layer 460. This FET is again formed on a semiconductor 451, and includes source/drains 452 and 453, channel 454, ferroelectric 458, electrode 459, and floating gate electrode 457 Barrier layer 461 is preferably iridium oxide ($IrO_2$), but may also be other suitable barrier materials. In addition, the MFM/SFET 450 illustrates another feature of the invention: the ferroelectric capacitor portion 464, i.e., the MFM portion, has a smaller capacitive area then the linear capacitor portion 465 formed by conductor 457, insulator 456, and channel 454, i.e., the MIS portion. Here "capacitive area" means the area of the capacitor in the plane of the capacitor, that is in a plane parallel to the long dimensions of the capacitor, which is a plane defined by the horizontal direction and the direction into the paper in FIG. 15. Since capacitance is proportional to the capacitive area of the capacitor and the voltage drop across each of a number of capacitors connected in series is inversely proportional to the respective capacitances of the capacitors, this results in a larger portion of the total voltage drop across the FET being across the ferroelectric. This, in turn, permits the ferroelectric FET to operate at a lower voltage. Preferably, the capacitive area of the MIS portion is between 2 times and 10 times the capacitive area of the MIS portion, and most preferably about 6 times. This feature of making the ferroelectric capacitor, such as 464, smaller in area than the insulator capacitor, such 465, to create a larger voltage drop across the ferroelectric capacitor can be used in any of the embodiments of the invention disclosed herein.

FIG. 16 shows a MFM/SFET 550 that includes a polysilicon layer 572 between electrode 557 and insulating layer 573. This FET is again formed on a semiconductor 551, and includes source/drains 552 and 553, channel 554, barrier layer 561, ferroelectric 558, and electrode 559. Barrier layer 561 may be conducting, but preferably is an insulator. Again, this embodiment is shown with linear, or MIS, capacitor 565 formed by polysilicon layer 572, insulator 573, and channel 554, having a larger area than the ferroelectric, or MFIM, capacitor 564 In this embodiment, the electrode 557 is shown having the area of ferroelectric capacitor 564, although it also could have the area of insulator capacitor 565.

In any of the above embodiments, one insulating barrier layer, such as 310, 250, 461, and 561 may be a compound selected from a group consisting of $Si_3N_4$, $IrO_2$, $ZrO_2$, $CeO_2$, and $Y_2O_3$. However, it may also be one of the materials according to the invention. This barrier layer preferably has a thickness of from 2 nm to 20 nm, and most preferably, about 4 nm. In all cases where the substrate, such as 81, 302, 41, 351, 451, and 551, is made of silicon, there may also be a thin layer of silicon oxide formed between the silicon substrate and the first of the FET insulator layers, such as barrier layer 250. This $SiO_2$ insulating layer preferably has a thickness of 4 nanometers (nm) to 20 nm. Each of these embodiments also contain at least one insulator layer, such as 92, 311, 252, 356, 460, and 573, is preferably one of the non-ferroelectric, high dielectric constant materials according to the invention. This insulator is preferably 4 nanometers (nm) to 50 nm thick. For gate insulators and buffer layers, the preferred material is a tungsten-bronze-type oxide. Preferably, it is a tungsten-bronze having the formula $AB_2O_6$, where A represents a material selected from the group consisting of strontium, barium, calcium, magnesium, and lead, and B represents a material selected from the group consisting of tantalum, niobium, and tungsten. It may be a solid solution of two or more of oxides having the formula $AB_2O_6$. The most preferred material has the formula $Sr(Ta_yNb_{1-y})_2O_6$, where $0 \leq y \leq 1$.

It should be understood that the invention contemplates that any and all of the features of the various embodiments of capacitors, transistors, DRAMS, and ferroelectric FETs disclosed above can be combined with each other. That is, the embodiments shown are exemplary and have been chosen to illustrate the respective features, and are not intended to be limiting to the particular combinations shown.

Figure 17:
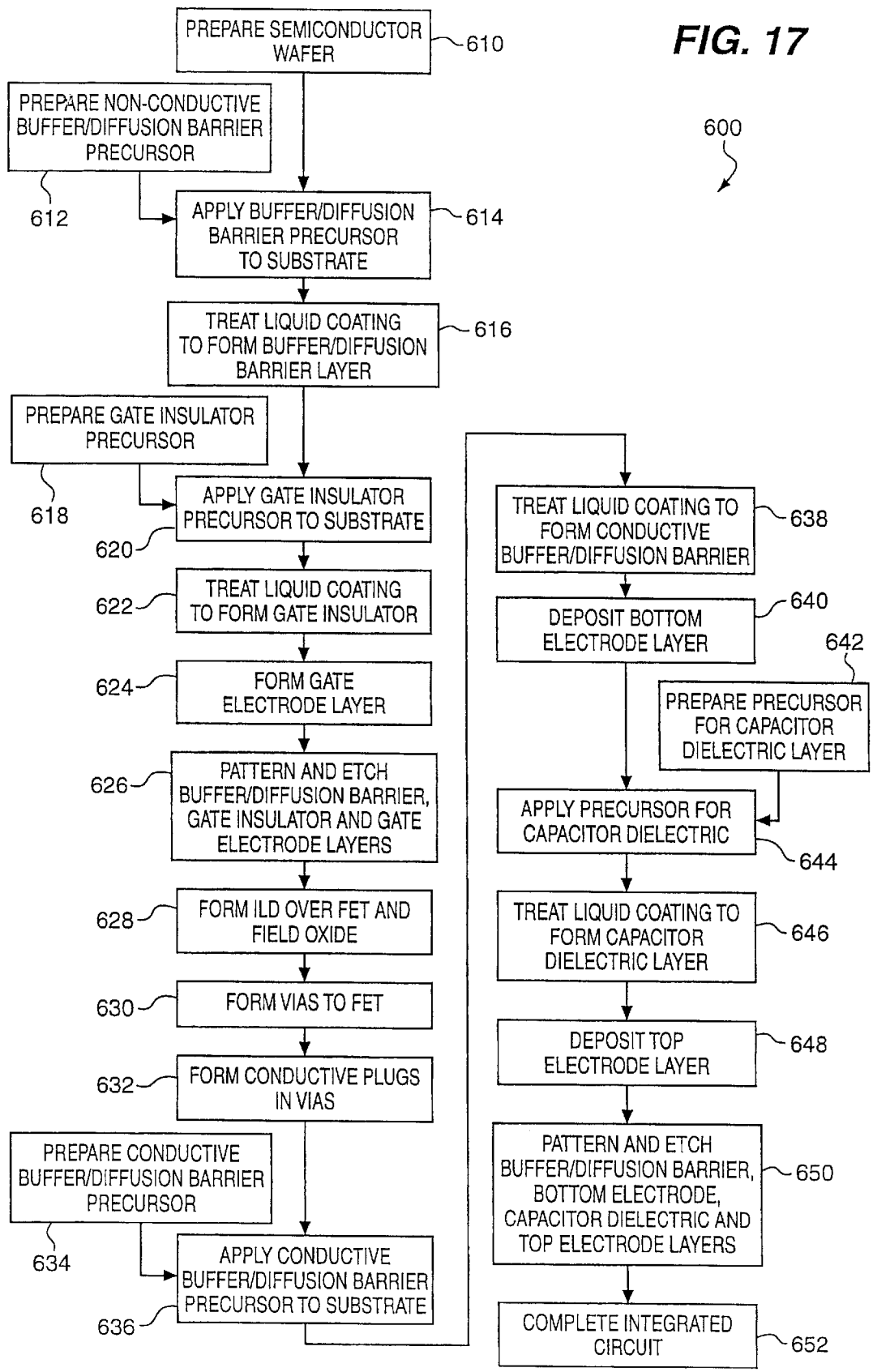
FIG. 17 is a flow chart showing the preferred embodiment of a method according to the invention for forming a DRAM memory cell including a gate insulator made of a material according to the invention, such as the DRAM memory cell of FIG. 12.

FIG. 17 shows a flow chart of a generalized process 600 according to the invention for forming a DRAM memory cell 300 (FIG. 12) of an integrated circuit. A feature of the method of the invention is the use of metal organic deposition ("MOD") precursors and deposition techniques for forming buffer and diffusion barrier layers and other high dielectric constant insulator thin films according to the invention. Individual MOD precursors are formed by interacting each of the metals of a desired compound, for example, cerium for the barrier layer compound, and strontium and tantalum for the high dielectric compound, or an alkoxide of the metal, with a carboxylic acid, or with a carboxylic acid and an alcohol, and dissolving the reaction product in a solvent. The carboxylic acids, alcohols, and solvents that may be used were listed above. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction. Initial MOD precursors are usually made or bought in batches prior to their use; the final precursor mixtures are usually prepared immediately before application to the substrate. Final preparation steps typically include mixing, solvent exchange, and dilution. When using a liquid deposition technique, for example, LSMCD, a metal 2-ethoxyhexanoate is a preferred precursor compound because the ethoxyhexanoates are stable in solution, have a long shelf life, form smooth liquid films, and decompose smoothly on a substrate.

In step 610, a semiconductor wafer comprising a silicon semiconductor substrate 302 is cleaned to remove contaminants, preferably by dipping the wafer into $H_2SO_4$ for 30 minutes. Then the wafer is dipped into 10:1 BOE for five minutes, which removes any natural oxide that may have formed on the wafer. A field oxide 304 is grown in a furnace, preferably to a thickness of 500 nm. Source/drain regions 306 and 308 and channel region 309 are then formed by a conventional doping method. This includes the usual photo resist, etching and strip steps for removal of the field oxide followed preferably by a phosphorous diffusion step. Preferably, the doping of channel region 309 is in the range of $2 \times 10^{15}$ to $10^{17}$ atoms/cm$^3$, and most preferably in the range of $10^{16}$ to $10^{17}$ atoms/cm$^3$, which provides a resistance of about 1 ohm to 5 ohms. Preferably, the doping of source/drain regions 306, 308 is in the range of $10^{19}$ to $10^{20}$ atoms/cm$^3$.

When nonconductive diffusion barrier layer 310 comprises $Si_3N_4$, it may be formed using conventional CVD techniques by reacting silane with ammonia in an argon plasma, or by reacting silane in a nitrogen discharge. Preferably, diffusion barrier layer 310 comprises a compound selected from a group including $IrO_2$, $ZrO_2$, $CeO_2$, and $Y_2O_3$. Preferably, diffusion barrier layer 310 is formed using a MOD technique in which a metal organic precursor is deposited by LSMCD and treated to form the desired metal oxide compound. A misted deposition method is preferred because the composition and deposition rate of the liquid precursor is more easily controlled than in alternative methods, thereby enabling formation of a very thin, uniform film of the barrier layer compound. A misted deposition process is described in U.S. Pat. No. 5,456,945, issued Oct.

10, 1995, to McMillan et al., which is hereby incorporated by reference as if fully contained herein. Other methods of applying a liquid to a substrate, such as a spin-on method, may also be used.

In the preferred embodiment of step 612, a 0.2 molar precursor solution of cerium 2-ethoxyhexanoate in xylenes solvent is diluted just before use to 0.1 molar concentration. In step 614, a liquid coating of the precursor is formed on the substrate by placing the substrate in a misted deposition reactor, forming a mist of the liquid precursor, and flowing the mist into the deposition reactor, where the mist deposits on the substrate. In step 616, the substrate and the liquid coating are treated to form a solid coating. Treating may comprise a process selected from the group including: exposing to vacuum, exposing to ultraviolet radiation, drying, heating, baking, rapid thermal processing, and annealing. Treatment in step 616 typically includes drying, rapid thermal processing ("RTP"), and annealing. Drying is typically performed for one minute at 160° C., then at 260° C. for four minutes. If used, the RTP is typically done at 725° C. for 30 seconds, with a 100° C./sec. ramping rate. A furnace anneal, preferably in an oxygen atmosphere, crystallizes the metal oxide compound. Annealing is conducted for 60 minutes at 800° C. in oxygen flowing at 5 l/m, with 10 minutes "push" and 10 minutes "pull". Nonconductive diffusion barrier layer 310 has a thickness of about 5 nm.

In step 618, a final precursor for gate insulator 311 is prepared. As described above, initial precursors preferably comprise metal 2-ethoxyhexanoates in xylenes or n-octane solvent. As an example, strontium 2-ethoxyhexanoate and tantalum 2-ethoxyhexanoate are mixed in n-octane solvent in relative molar proportions corresponding to the stoichiometric formula $SrTa_2O_6$. A 0.2 molar solution of the mixture is diluted with n-butyl acetate to 0.1 molar concentration.

In step 620, the substrate comprising the diffusion barrier layer 310 is placed in a liquid deposition reactor, and a mist is made from the final precursor for the gate insulator, and the mist is flowed into the deposition reactor, where it forms a liquid coating of the precursor on the diffusion barrier layer.

In step 622, the substrate with the liquid coating is treated to form thin film gate insulator 311, which may be any of the materials of the invention. Treating may comprise a process selected from the group including: exposing to vacuum, exposing to ultraviolet radiation, drying, heating, baking, rapid thermal processing, and annealing. In the preferred embodiment, the precursor is treated by drying and oxygen annealing. Drying is done at a temperature of between 100° C. and 350° C. for a time of between 30 seconds and 10 minutes, preferably on a hot plate. Preferably, the drying is done in a plurality of drying steps, each one at a higher temperature than the previous one. In the samples below, the drying was done in two steps, one at 160° C. for one minute and another at 260° C. for four minutes. If used, baking may include a RTP bake or a furnace bake, though in the preferred embodiment it is a hot plate bake. If a RTP bake is utilized, it uses a halogen light source to raise the wafer rapidly to a high temperature in the range of from 500° C. to 850° C. for a bake time of between 15 seconds and 3 minutes. Annealing is done at a temperature of from 500° C. to 850° C. from 30 minutes to three hours. In the examples above, the annealing was done at 800° C. for 30 minutes. Gate insulator 311 has a thickness of about 15 nm.

In step 624, gate electrode 312 is deposited using conventional techniques, typically a sputtering technique. Typically, diffusion barrier 310, gate insulator 311 and gate electrode 312 are patterned and etched in a single sequence of conventional techniques in step 626 Then, in steps 628, 630 and 632, respectively, ILD 316, vias 317, 318 and tungsten plugs 319, 320 are formed using conventional techniques.

Next, diffusion barrier layer 321 is formed. It may be formed using conventional sputtering techniques. For example, if diffusion barrier layer 321 comprises $Ti_3N_4$ or another nitride, then a thin film may be deposited by sputtering a nitride target or a metal target in a nitrogen atmosphere. In the preferred method, however, a conductive oxide is formed using MOD precursors. Since a very thin film thickness is desired, preferably in the range of 1 nm to 20 nm, it is preferable to form diffusion barrier layer 321 comprising $IrO_2$ using a MOD precursor and a LSMCD technique. In step 634, a precursor comprising a 0.1 molar solution of iridium 2-ethoxyhexanoate is prepared. In step 636, it is misted and flowed into a misted deposition reactor, where it forms a liquid coating on the substrate. In 638, the liquid coating is treated, as described above in reference to diffusion barrier layer 310 in step 616, to form diffusion barrier layer 321 comprising a thin film of $IrO_2$ having a thickness of 5 nm. In step 640, platinum bottom electrode 322 having a thickness of 200 nm is sputter-deposited using conventional techniques.

In step 642, a precursor for capacitor insulator 324 is prepared, as in step 618 above. In step 644, a mist of the precursor is deposited to form a liquid coating on the platinum bottom electrode layer. In step 646, the liquid coating is treated as in step 622 to form the capacitor insulator layer, which may be any of the materials according to the invention, for example, a thin film of $SrTa_2O_6$ having a thickness of 80 nm. In step 648, platinum top electrode layer 326 is formed using conventional techniques. Layers 321, 322, 324 and 326 are preferably patterned and etched together in step 650 to form a stacked structure of memory capacitor 328. Thereafter, in step 652, memory cell 300 is completed using conventional techniques to form ILD 336, local interconnects 338, 339, and passivation layer 342.

There has been described novel integrated circuit electronic devices utilizing metal oxide dielectric materials in which the various electronic properties can be maximized for a specific application by adjusting the relative proportions of constituent elements. In particular, the invention relates to metal oxides made from precursors for forming $(Ba_xSr_{1-x})(Ta_yNb_{1-y})_2O_6$, where $0 \leq x \leq 1.0$ and $0 \leq y \leq 1.0$; $(Ba_xSr_{1-x})_2(Ta_yNb_{1-y})_2O_7$, where $0 \leq x \leq 1.0$ and $0 \leq y \leq 1.0$; and $(Ba_xSr_{1-x})_2Bi_2(Ta_yNb_{1-y})_2O_{10}$, where $0 \leq x \leq 1.0$ and $0 \leq y \leq 1.0$. The uses of the inventive materials include gate dielectric transistors, a capacitor dielectric in DRAMs and MMICs, buffer layers, diffusion barriers, and ILD layers. In some instances, the material may be ferroelectric and would, therefore, be used in FERAMs. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that the advantageous use of the inventive metal oxide materials in integrated circuits has been disclosed, the materials can be advantageously used as insulators in integrated circuit applications other than those described. Other processes may be used to form the metal oxide devices than the exemplary processes described above. It is clear from the above that various formulations may be used. Further, the precursors, processes and structures can be combined with conventional processes to provide variations on the processes and devices described. It is also evident that the process steps recited may, in some instances, be performed in a different order, or equivalent structures and processes may be substituted for the various structures and processes described. Consequently, the invention is to be construed as embracing each and every novel feature and novel combination of features present in and/or possessed by the precursors, precursor formation processes, electronic devices, and electronic device manufacturing methods described.

We claim:

1. An integrated circuit comprising a non-ferroelectric, high dielectric constant insulator, said insulator including a thin film of a metal oxide selected from the group consisting of combinations of a non-perovskite interlayer oxide of Bi, Sc, Y, La, Sb, Cr or Tl with an oxide selected from the group consisting of perovskites and pyrochlore oxides.

2. An integrated circuit as in claim 1 wherein said interlayer oxide is $Bi_2O_3$.

3. An integrated circuit as in claim 1 wherein said metal oxide is a combination of $Bi_2O_3$ with a pyrochlore-type oxide having a formula $A_2B_2O_7$, wherein A represents A-site atoms selected from the group of metals consisting of Ba, Bi, Sr, Pb, Ca, K, Na and La; and B represents B-site atoms selected from the group of metals consisting of Ti, Zr, Ta, Hf, Mo, W and Nb.

4. An integrated circuit as in claim 3 wherein said pyrochlore oxide has a formula $(Ba_xSr_{1-x})_2(Ta_yNb_{1-y})_2O_7$, wherein $0 \leq x \leq 1.0$ and $0 \leq y \leq 1.0$.

5. An integrated circuit as in claim 3 wherein said pyrochlore oxide has a formula $(Ba_xSr_{1-x})_2Ta_2O_7$, wherein $0 \leq x \leq 1.0$ and $0 \leq y \leq 1.0$.

6. An integrated circuit as in claim 1 wherein said thin film has a thickness ranging from 1 nm to 500 nm.

7. An integrated circuit as in claim 1, further comprising a first electrode and a second electrode, said thin film located between said first and second electrodes.

8. An integrated circuit as in claim 1 wherein said thin film is part of a memory cell.

9. An integrated circuit as in claim 1 wherein said thin film is part of a bypass capacitor.

10. An integrated circuit as in claim 1 wherein said thin film is part of a transistor.

11. An integrated circuit as in claim 10 wherein said thin film comprises a gate insulator.

12. An integrated circuit as in claim 11 wherein said transistor is a ferroelectric FET including a substrate and a ferroelectric layer and said gate insulator is located between, said ferroelectric layer and said substrate.

13. An integrated circuit as in claim 1 wherein said thin film is part of a MMIC.

14. An integrated circuit as in claim 1 wherein said thin film comprises an interlayer dielectric.

15. An integrated circuit as in claim 1 wherein said thin film is a virtual stacked structure comprising a layer of said, oxide alternating with a layer selected from the group consisting of perovskite layers and pyrochlore oxide layers.

16. An integrated circuit as in claim 15 wherein said interlayer oxide comprises $Bi_2O_3$.

17. An integrated circuit comprising a high dielectric constant insulator, said insulator Including a thin film of a metal oxide, said thin film being an actual stacked structure comprising a layer of a non-perovskite interlayer oxide of Bi, Sc, Y, La, Sb, Cr or Tl having an interface with a non-ferroelectric, metal oxide layer selected from the group consisting of perovskite layers and pyrochlore oxide layers.

18. An integrated circuit as in claim 17 wherein said interlayer oxide layer comprises $Bi_2O_3$.

19. An integrated circuit having a metal oxide thin film comprising an actual stacked structure including a layer of a non-perovskite interlayer oxide of Bi, Sc, Y, La, Sb, Cr or Tl alternating with a metal oxide layer selected from the group consisting of perovskite layers and pyrochlore oxide layers, said thin film including at least three interfaces between said interlayer oxide and said metal oxide.

20. An integrated circuit as in claim 19 wherein said interlayer oxide layer comprises $Bi_2O_3$.

21. An integrated circuit as in claim 19 wherein said metal oxide is non-ferroelectric.

22. An integrated circuit as in claim 19 wherein said metal oxide is ferroelectric.

23. An integrated circuit comprising a non-ferroelectric, high dielectric constant insulator thin film, said thin film being an actual stacked structure comprising a layer of a non-perovskite interlayer oxide of Bi, Sc, Y, La, Sb, Cr or Tl alternating with a metal oxide layer selected from the group consisting of perovskite layers, and pyrochlore oxide layers.

24. An integrated circuit as in claim 23 wherein said interlayer oxide layer comprises $Bi_2O_3$.

25. An integrated circuit comprising a thin film of a metal oxide, said thin film being a virtual stacked structure comprising layer of a non-perovskite interlayer oxide of Bi, Sc, Y, La, Sb, Cr or Tl alternating with a metal oxide layer selected from the group consisting of and pyrochlore oxide layers.

26. An integrated circuit as in claim 25 wherein said interlayer oxide layer comprises $Bi_2O_3$.

27. An integrated circuit as in claim 25 wherein said metal oxide is non-ferroelectric.

28. An integrated circuit as in claim 25 wherein said metal oxide is ferroelectric.

29. An integrated circuit including a non-ferroelectric, high dielectric constant insulator thin film comprising a metal oxide selected from the group consisting of materials having the chemical formula $A_2Bi_2B_2O_{10}$, wherein A represents A-site atoms selected from the group of metals consisting of Ba, Bi, Sr, Pb, Ca, K, Na and La; and B represents B-site atoms selected from the group of metals consisting of Ti, Zr, Ta, Hf, Mo, W and Nb.

30. An integrated circuit as in claim 29 wherein said metal oxide is $(Ba_xSr_{1-x})_2Bi_2(Ta_yNb_{1-y})_2O_{10}$, wherein $0 \leq x \leq 1.0$ and $0 \leq y \leq 1.0$.

31. An integrated circuit as in claim 29 wherein said metal oxide is $(Ba_xSr_{1-x})_2Bi_2Ta_2O_{10}$, wherein $0 \leq x \leq 1.0$.

32. An integrated circuit as in claim 31 wherein $0 \leq x \leq 0.6$.

33. An integrated circuit as in claim 31 wherein $0.4 \leq x \leq 0.5$.

34. An integrated circuit as in claim 29 wherein said metal oxide has a voltage coefficient of capacitance, Vcc, not exceeding ±1% over an applied voltage range of from zero volts to ±5 volts.

35. An integrated circuit as in claim 29 wherein said metal oxide has a temperature coefficient of capacitance, Tcc, not exceeding 1000 ppm through the temperature range of 20° C. to 140° C.

36. An integrated circuit as in claim 29 wherein said metal oxide has a temperature coefficient of capacitance, Tcc, not exceeding 100 ppm through the temperature range of 20° C. to 140° C.

* * * * *